(12) United States Patent
Lukis et al.

(10) Patent No.: US 7,574,339 B2
(45) Date of Patent: Aug. 11, 2009

(54) AUTOMATED GENERATION OF LEAN MODELS FOR INJECTION MOLDING SIMULATION

(75) Inventors: Lawrence J. Lukis, Wayzata, MN (US); Yuri Dreizin, Golden Valley, MN (US)

(73) Assignee: The Protomold Company, Maple Plain, MN (US)

( * ) Notice: Subject to any disclaimer, the term of this patent is extended or adjusted under 35 U.S.C. 154(b) by 251 days.

(21) Appl. No.: 11/523,232

(22) Filed: Sep. 19, 2006

(65) Prior Publication Data

US 2008/0126047 A1    May 29, 2008

(51) Int. Cl.
*G06G 7/50* (2006.01)
(52) U.S. Cl. .......................................... 703/9; 700/197
(58) Field of Classification Search ............... 703/9; 700/98, 197
See application file for complete search history.

(56) References Cited

U.S. PATENT DOCUMENTS

| 6,096,088 | A | 8/2000 | Yu et al. | |
|---|---|---|---|---|
| 6,252,601 | B1 | 6/2001 | Tanaka | |
| 6,560,570 | B1 * | 5/2003 | Dohrmann et al. | 703/7 |
| 6,704,693 | B1 | 3/2004 | Fan et al. | |
| 6,823,297 | B2 * | 11/2004 | Jenny et al. | 703/2 |
| 2006/0129366 | A1 * | 6/2006 | Shaw | 703/10 |

OTHER PUBLICATIONS

Geng Tie et al., "three-dimensional finite element method for the filling simulation of injection molding", May 2006, Engineering with Computers, vol. 21, pp. 289-295.*

E. Pichelin et al., "finite element solution of the 3D mold filling problem for viscous imcompressible fluid", 1998, Computer methods in applied mechanics and engineering, vol. 163, pp. 359-371.*

Stefan Weyer et al., "Automatic finite element meshing of planar Voronoi tessellations", 2002, Engineering fracture Mechanics, vol. 69, pp. 945-958.*

Soji Yamakawa et al., "Layered Tetrahedral Meshing of Thin-Walled Solids for Plastic Injection Molding FEM", 2005, Proceedings of the 2005 ACM symposium on solid and physical modeling, pp. 245-255.*

(Continued)

*Primary Examiner*—Paul L Rodriguez
*Assistant Examiner*—Russ Guill
(74) *Attorney, Agent, or Firm*—Beck & Tysver, PLLC

(57) ABSTRACT

The present invention is a method and system for simulating fluid flow in a cavity, having relevance to the modeling of viscous flows within thin cavities of complex shapes in which heat exchange with the cavity walls may be a governing factor, as in injection molding of plastic parts. Its automated discretization scheme, in which the model cavity is partitioned into macrocells, each macrocell having substantial contact areas with the model cavity walls, eliminates the need for time consuming and expensive manual model configuration required by some modeling methods. Because of the simplicity of the discretization, models based on the invention are less demanding on computer resources then conventional finite element methods, and execute more quickly. A key innovation of the method is a function characterizing the shape of a macrocell that appears in a coefficient in equations governing the flow. As a consequence of the improvements offered by the invention, molds for complex parts can be fabricated more rapidly, with the resulting parts having high quality.

18 Claims, 13 Drawing Sheets

OTHER PUBLICATIONS

W.R. Quadros et al. "Hex-layer: layered all-hex mesh generation on thin section solids via chordal surface transformation", 2002, Proceedings of 11th international meshing roundtable, 12 unnumbered pages.*

Qiang Du et al., "Grid generation and optimization based on centroidal Voronoi tessellations", 2002, Applied Mathematics and Computation, vol. 133, pp. 591-607.*

Leonidas J. Guibas et al., "Randomized Incremental Construction of Delaunay and Voronoi Diagrams", 1992, Algorithmica, vol. 7, pp. 381-413.*

Qiang Du et al., "Recent progress in robust and quality Delaunay mesh generation", available online Sep. 2005, 2006, Journal of Computational and Applied Mathematics, vol. 195, pp. 8-23.*

Yasushi Ito et al., "Improvements in the reliability and quality of unstructured hybrid mesh generation", 2004, International Journal for Numerical Methods in Fluids, vol. 45, pp. 79-108.*

Per-olof Persson et al., "A simple mesh generator in Matlab", Jun. 2004, SIAM Review, vol. 46 (2), pp. 1-17.*

Steven J. Owen, "A survey of unstructured mesh generation technology", 1998, 7th International Meshing Roundtable, 25 unnumbered pages.*

F.P.T. Baaijens, Calculation of Residual Stresses in Injection Molded Products, Rheologica Acta, 1991.

Vaughan R. Voller, A Monte Carlo Scheme for Tracking Filling Fronts, Journal of Computational Physics, 2004, www.elsevier.com/locate/jcp.

Peter Kennedy, Flow Analysis of Injection Molds, Hanser Publishers, NY, 1995 (237 pp.), Table of Contents.

Peter Kennedy, Flow Analysis of Injection Molds, Hanser Publishers, NY, 1995 (5.5 pp.).

Peter Kennedy, Flow Analysis of Injection Molds, Hanser Publishers, NY, 1995 (5.1-5.2 pp.).

Peter Kennedy, Flow Analysis of Injection Molds, Hanser Publishers, NY, 1995 (9.1-9.4 pp.).

* cited by examiner

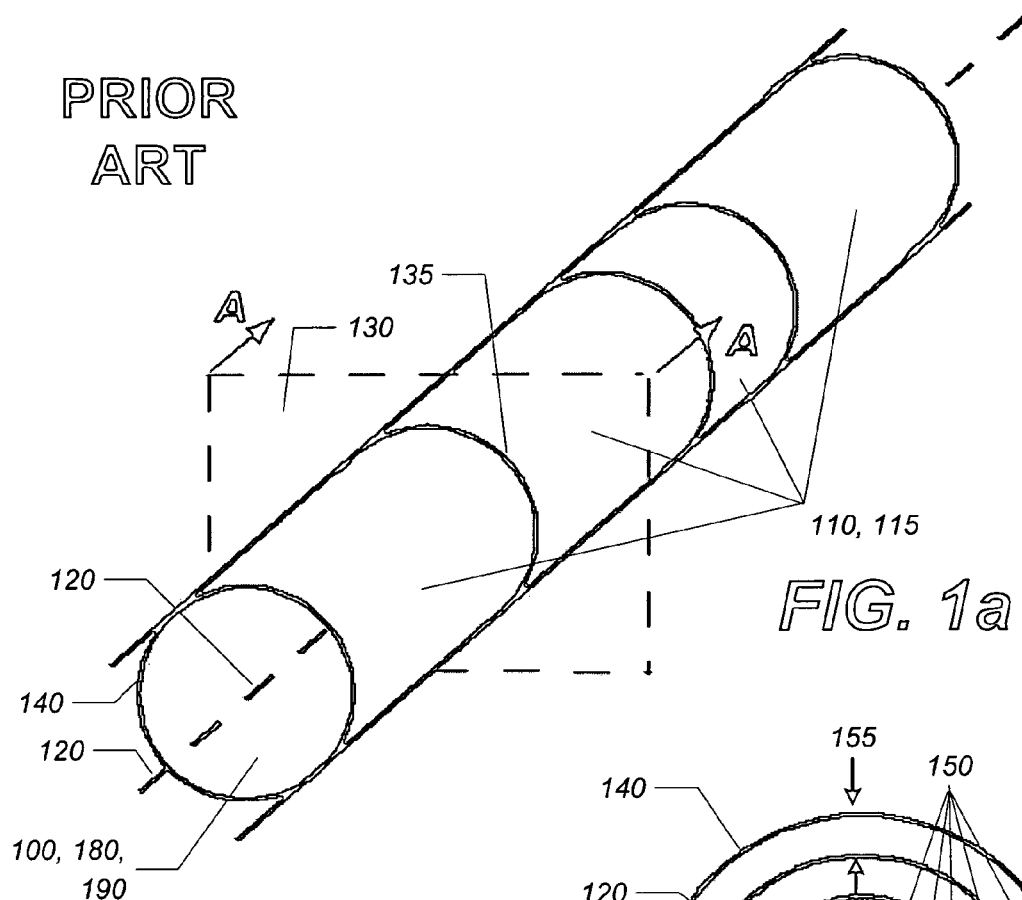
FIG. 1a
PRIOR ART
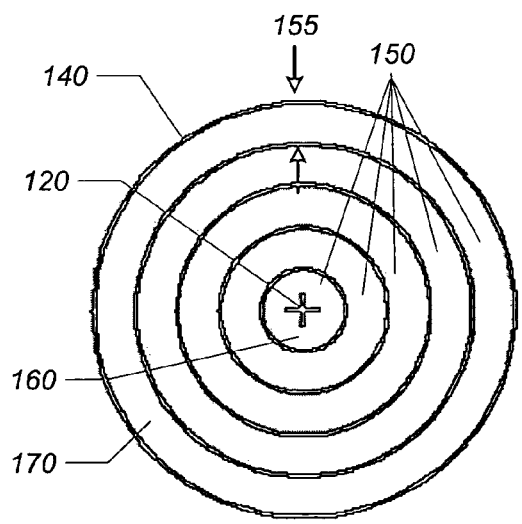
FIG. 1b  Section A-A
PRIOR ART

Section A-A

Section A-A

AUTOMATED GENERATION OF LEAN MODELS FOR INJECTION MOLDING SIMULATION

FIELD OF THE INVENTION

The present invention relates to the computer simulation of fluid flows and its industrial applications. More particularly, it relates to the modeling of viscous flows within thin cavities of complex shapes in which heat exchange with the cavity walls may be a governing factor, as in injection molding of plastic parts.

BACKGROUND OF THE INVENTION

In injection molding, a very viscous molten polymer material, or resin, is forced to flow under high pressure into a mold cavity, essentially corresponding in shape to the desired part, until the resin completely fills the cavity. During the filling, the molten resin (or melt) begins to cool, eventually solidifying into the plastic part.

In addition to the portion of the mold cavity that reflects the shape of the desired part, the mold cavity may include runners (ducts through which molten resin flows from the nozzle of an injection molding press) ending in gates (determining injection locations and freezing sooner than interior resin in order to trap the resin inside the cavity). The term cavity is sometimes regarded as including runners and gates, but sometimes not. The remainder of this document applies equally well to either definition.

The physics of injection molding, especially in aspects related to viscous flow and cooling, is reasonably well known. Properties of molten resins needed for simulation can be either directly measured or extrapolated with a certain degree of accuracy.

Computer models for simulation of injection molding have been developed and implemented in sophisticated and expensive commercially available software. The intent of the software is to reduce trial and error in both part and mold design, as well as to aid in setting up parameters controlling the molding process. Model simulations can forecast the likelihood that, for example, the resin will not entirely fill the cavity before it freezes; regions of weakness (e.g, weld lines) may be present in the molded plastic part; air traps might occur causing unfilled bubbles in the molded part; or the molded part might have unacceptable sink marks, burns or other blemishes. After a computer model has been built for a cavity of a particular shape, it can be used many times to run simulations, possibly with different resins or process parameters. An unfavorable result from a simulation may lead to a redesign of the mold or of the part, or even to termination of the project. Failure can be avoided before a mold for the part is made. Several software products for simulation of injection molding are commonly used in industry, including products developed and marketed by Moldflow Corporation of Framingham, Mass.

Computer simulation of injection molding involves establishing a numerical flow model that expresses the balances of mass, forces and energy within the mold cavity. The equations representing these balances are called the governing equations of the flow. The equations can be solved to show how the pressure, velocity, and temperature variables will evolve over time within the various regions of the cavity. Predicting the time evolution of these flow variables throughout the spatial domain of the cavity is the essence of the simulation process.

The model is called a numerical model because the shape of the cavity and the flow variables at various times are represented by numbers within the computer, and also because various approximations may be made to the governing equations themselves and to their discrete analogs. The software code applies the discretized governing equations to the flow variables to advance them forward in simulated time, from the start of injection of the molten resin into the cavity and continuing usually until the resin completely freezes.

While the number of points within any given cavity is theoretically infinite, a numerical model only represents the flow with a finite number of flow variables assigned to a finite number of spatial locations. A numerically simulated flow is only an approximation to the behavior of a real resin injected into a real cavity. Many methods of reducing the theoretical governing equations (i.e., those that operate on continuous space and time variables) to discretized equations (representing reality with a finite number of spatial locations and distinct points in time) are known in the art. Underlying every numerical model is a discretization scheme, typically reflecting certain assumptions about the dependence of the flow variables (e.g., velocity, pressure, and temperature) upon spatial location and time. Most discretization schemes use discrete time steps. At each time step the balance equations are solved to update the flow variables in the region of the cavity currently filled with resin, and to determine the advance of the flow front.

Spatial discretization schemes in any flow model often fall into two broad categories. In finite difference modeling, a grid of points is imposed over the spatial domain being modeled. Flow variables are simulated at specific locations within each resulting gridcell. In finite element modeling, the spatial domain is subdivided into a mesh of small elements of certain predefined types typically having relatively simple shapes such as a tetrahedron or a prism. Mixed spatial discretization schemes are sometimes used; for example, finite elements might be used to represent some variables along an axis or in a plane, while levels or layers might be employed in the perpendicular direction, so that variables assigned to the layers are handled using finite difference methods.

Building the flow model may take considerable time, but even more time is often spent running simulations with the model. Generally, model accuracy increases when either the density of grid points or spatial elements is increased or the time step is shortened, but models having better resolution in space or time execute more slowly than their more coarsely discretized counterparts. (Refinement of the spatial and time discretization schemes in fluid flow are often coupled—refining the spatial grid may require a shorter time step.) Simulations that are slow to execute are costly, in terms of both consumption of computer resources and time elapsed on the wall clock while people are waiting to analyze the results. A choice of parameters determining space and time resolution of a discretization scheme necessarily involves tension between the need for greater accuracy and the need for faster execution.

One conceptually simple way to build a numerical flow model is to apply finite element methodology to a tetrahedral mesh filling the cavity. This approach may take advantage of existing algorithms for automated generation of tetrahedral meshes in three-dimensional (3D) domains with triangulated boundaries, as taught, for example, in U.S. Pat. No. 6,252, 601. However, to capture strong variations of temperature, velocity and, especially, viscosity between the cavity walls, the mesh elements must be much smaller than the local part thickness. For this reason, 3D meshes suitable for simulation of injection molding produce very large flow models with hundreds of thousands, if not millions, of mesh elements and flow variables. The number of mesh elements can be especially large if numerous shallow features at the surface of the part, such as lettering or serration, have to be filled by the mesh. Solving very large models with computing resources typically available in the industry can be unacceptably slow and impractical. Thus, leaner (i.e., smaller and more efficient) flow models are often desired even though models based on 3D finite element methods are potentially more accurate.

Historically, simulation of injection molding was first developed for simple parts shaped as thin plates or shells with gradually varying thickness. The cavity might additionally include one ore more runners shaped usually as narrow round channels, either straight or curved. The flow of resin in two simple cavity geometries—thin more or less flat cavities and narrow round channels—lends itself to certain simplifications known as the Hele-Shaw (HS) approximations. Flow models based on these approximations do not resolve small details such as the fine structure of the flow front, but they can represent the overall picture of injection molding within such narrow channels and thin cavities reasonably well.

When HS models are used to simulate flow within thin and essentially flat cavities, simulation can be done considerably faster than with models based on exact governing equations. The efficiency of HS approximations in this geometry derives from the fact that due to high viscosity the flow is laminar and largely controlled by the proximate cavity walls, and the pressure variation in the direction normal (i.e., perpendicular) to the walls is much smaller than in the flow direction, which is parallel to the walls. The pressure field is therefore essentially two-dimensional, and can be approximated using 2D finite elements covering the midsurface of the thin cavity (i.e., an imagined surface equidistant from the opposite cavity walls). In a cylindrical channel, the other special geometry for which the HS model has been developed, the pressure can be approximated even more simply using 1D finite elements arranged along the channel axis. As a consequence, in both geometries, the discretization of the pressure field requires significantly fewer variables. This is particularly important because pressures at different spatial locations are tightly coupled together, as can be seen from the fact that placing an obstacle to flow in one location within the cavity nearly immediately affects the flow pattern everywhere. For this reason, the pressure field is usually determined at each time step by solving a large system of equations. The significant reduction in the number of pressure variables through the HS approximation greatly reduces simulation time.

As mentioned previously, in a thin quasi-flat cavity, a 2D mesh of finite elements with which pressure is approximated can be constructed covering the midsurface of the cavity. Each 2D mesh element can be extended by simply projecting it in the cross-midsurface direction to the bounding walls, and the resulting 3D element approximated by a prism. Because of the particular cavity geometry, prismatic elements are referred to as flat elements. Such a 3D perspective is needed because, unlike the pressure field, the temperature and velocity fields vary strongly between opposing cavity walls. Within flat elements, these fields can be described by their profiles $T_i(z, t)$ and $u_i(z, t)$, where z is the coordinate in the direction perpendicular to the midsurface, t is time, and i is the index of an element.

In the even simpler case of a narrow round channel, pressure can be approximated by 1D mesh of elements constructed along the channel axis, and, similar to the flat case, each element can then be projected out perpendicularly to the channel axis. The resulting quasi-cylindrical element is approximated by a round cylinder. Within a cylindrical element, the temperature and velocity fields can be described by their radial profiles $T_i(r, t)$ and $u_i(r, t)$.

The governing equations controlling pressure, temperature and velocity in a cavity, under the assumption that the cavity can be approximated using only flat and cylindrical elements, are discussed in detail in the book *Flow Analysis of Injection Molds* by Peter Kennedy (Hanser Gardner Publications, 1995). The book also discusses procedures for assembling numerical HS flow models in simple cavities.

Illustration of the Nature of HS Approximation

In general, the temperature at a particular point in the cavity is controlled by two physical processes, advection and heat conduction. Advection occurs when a fluid moves, carrying hot and cold spots along with the movement. Heat conduction is caused by the random motion of molecules internal to the fluid, and will occur whether or not the fluid is in motion. It is conduction that will gradually bring a hot molded plastic part to mold temperature. It should be noted that turbulent diffusion of heat, a third process important in some fluid flow contexts, is unimportant to injection molding because the melt is strongly viscous, resulting in laminar flow.

The nature of the simplified treatment of the flow in the two geometries for which HS equations have been derived in the prior art is illustrated here by considering the pure cooling stage, which starts after resin has filled the entire cavity and its motion has essentially stopped. At this point, the temperature of the fluid changes solely due to heat conduction.

In the case of a round runner, the HS equation describing heat conduction in a cylindrical element characterized by a radius R can be written as $$\frac{\partial}{\partial t} E(r, t) = -q(r, t), \quad 0 < r < R, \tag{1}$$

wherein E(r, t) is the thermal energy per unit length contained in the core region of radius r of the cylindrical element, $$E(r,t) = \int_0^r cT(r_1,t) 2\pi r_1 dr_1, \tag{2}$$

q(r, t), the heat flux per unit length carrying heat toward the wall through the surface of the core region, can be written according to Fourier's law as $$q(r, t) = -2\pi r \kappa \frac{\partial}{\partial r} T(r, t). \tag{3}$$

c and κ correspond, respectively, to volumetric heat capacity and conductivity. The HS approximation for heat conduction in the cylindrical element is based not only on the assumption that the temperature within the element depends on only one spatial coordinate, in this case on radius r, but also on the assumption that the energy exchange with neighboring elements due to heat conduction is negligibly small. Both assumptions are well-justified provided that the element belongs to a long and narrow channel, and is not located at one of its ends.

The equation for heat conduction in a flat element characterized by half-thickness R can be written in a form nearly identical to equations (1)-(3), but, in this geometry, r represents the distance from the midsurface. E(r, t) and q(r, t) should now be understood as the thermal energy and heat flux per unit area, respectively, of a core layer with half-thickness r. The only difference from the round channel case is in the coefficients, which, as should be expected, depend on the channel geometry. Namely, in equations (2) and (3) respectively, the coefficients $2\pi r_1$ and $2\pi r$, which can be viewed as shape functions characterizing cylindrical geometry, in the case of a flat geometry are replaced by a constant.

The profiles of temperature and velocity can be discretized using their values in a stack of layers that are generally parallel to the walls. For the geometry approximated by flat and cylindrical elements, typical layers are shown schematically in FIG. 1b and FIG. 2b, respectively, which are described in the section entitled "Detailed Description of the Invention." The number of layers is commonly selected to be between 6 and 15 depending on the compromise between accuracy and speed requirements. In a numerical HS flow model, the total number of temperature and velocity variables throughout the mold cavity is thus typically 12-30 times larger than the total number of pressure variables. However, the profiles of temperature and velocity can be computed locally, unlike the pressure distribution, which requires global solution due to the strong coupling previously mentioned. Even when advection, describing the energy transfer by resin flow, is taken into account, explicit methods, which are known to practitioners of numerical modeling to be computationally fast, can be used to solve for the temperature and velocity fields at each time step. This explains why a large number of temperature and velocity variables less adversely affects computational performance than a comparable number of pressure variables would.

Appendix A provides a simplified example of a numerical HS flow model for a thin cavity having a gradually varying thickness. Such a cavity is shown schematically in FIG. 2a and FIG. 2b. In summary of the preceding discussion and Appendix A, the construction of numerical HS flow models for flat and shell-like parts requires constructing a mesh on the midsurface of the cavity, and assigning appropriate thicknesses to the mesh elements. The models combine two-dimensional description of pressure with the set of 1D profiles of temperature and velocity within each element. Such surface with thickness models are often referred to as 2.5D models.

Application of the HS Approach to Other Geometries

The HS approach was also applied to building flow models for more complex parts such as ribbed parts as well as parts containing various shallow features. In ribbed parts, the midsurface branches at the intersections where ribs connect with each other or with the main shell. The classical HS approximations do not work near intersections, as the standard flat and cylindrical elements cannot approximate the local geometry. The same is true for edges and rough shallow features. Consequently, in such locations discretized HS type equations are specified on an ad hoc basis, most often using flat elements with artificially assigned effective thicknesses.

Early implementations of 2.5D modeling required labor-intensive involvement of highly skilled technicians in the semi-manual construction of branched 2D meshes and assigning effective geometric characteristics to elements as needed to create complete flow models. The scarcity of, and consequently high pay demanded by, such skilled technicians hindered application of 2.5D modeling to parts with more complex shapes, and increased the importance of developing an automated setup of 2.5D models to minimize the time and expense associated with injection molding simulations.

Attempts to generate 2.5D models by automating the construction and consequent meshing of midsurfaces had little or no success, partly because the necessary mathematical generalization of midsurface, the skeleton, is a complex geometric object for non-trivially shaped parts. However, an interesting roundabout solution, called DUALDOMAIN technology, was developed and implemented by Moldflow Corporation in some of its software products.

In particular, U.S. Pat. Nos. 6,096,088 and 6,704,693 describe methods of essentially 2.5D modeling that do not require construction of branched 2D midsurface meshes. Instead, pre-existing or purposely constructed 2D meshes on the cavity walls are employed. Flow is modeled on paired meshes on opposing cavity walls. Each flow variable at a point in the interior of the mold cavity is assigned, redundantly, to two model elements associated with matched mesh elements, one from each of two opposing walls near the point. DUALDOMAIN technology then attempts to eliminate this redundancy by ensuring that the matched elements are assigned the same thickness, and by forcing synchronization of flow variables in the matched elements during simulation. For parts with moderately complex shapes, DUALDOMAIN technology enables automated flow model generation and produces efficient and reasonably accurate flow models.

It appears, however, that more complex thin-walled parts, in particular parts with numerous shallow features, may still be problematic for DUALDOMAIN technology. For example, serration and other intricate features on a large area of the part surface may result in a massively incorrect element matching, as well as lead to erroneous thickness assignments. To avoid this, defeaturing of the part design is usually recommended. But defeaturing can be a labor-intensive operation on par with the semi-manual midsurface construction, especially if it has to be done after the part geometry is exported out of the CAD program in which it was designed. Also, handling intersections where two or more geometric features come together may still require assigning effective thicknesses to some model elements on a case by case basis.

SUMMARY OF THE INVENTION

The inventors recognized that an opportunity exists to develop more universal and robust methods for building lean HS-type flow models, methods that would allow complete automation of simulation setup for a much wider variety of thin-walled parts. Rather than matching mesh elements and synchronizing flow variables on opposing pairs of walls as proposed by DUALDOMAIN technology, a more direct way to build lean flow models for 2.5D modeling would be to construct, for a given cavity, a system of explicitly defined 3D spatial elements and use them as control volumes in balance equations. Such methods should preserve the spirit and efficiency of HS approximation and the general structure of discretized HS equations.

Due to the nature of HS flows, the balance of mass (from which pressure can be determined) should be applied to relatively large control volumes, or macrocells, while the balance of forces and energy, determining the velocity and temperature profiles within the macrocells, should be applied to a system of layers in the cells. Within a tubular portion of the cavity, the macrocells should be approximately cylindrical, and the layers annular. Within a generally flat cavity, the macrocells should be located between two opposing cavity walls and have approximately prismatic shapes, with the layers parallel to the walls. A macrocell located near an intersection or an edge might have a more complex shape and be in contact with more than two "opposing walls." The notion of layers in such macrocells should be generalized so that layers are still "generally parallel" to the walls.

Applying generalized discretized HS equations to macrocells that are shaped differently from the flat and cylindrical elements of the prior art is one object of the invention. Automatically and explicitly partitioning the model cavity volume into suitable macrocells and layers and determining their geometric characteristics appearing in generalized HS equations is another object of the invention. Applying generalized HS flow models to simulations of the fluid flow is the third object of the invention.

A general method for building numerical 2.5D flow models applicable to thin but otherwise arbitrary shaped thin cavities is presented. In one major aspect of the invention, it uses a simplified, locally 1D, treatment of balance equations in macrocells, even in irregularly shaped macrocells reflecting complexities of part geometry. In deriving these equations, the velocity at any interface between two adjacent macrocells is considered parallel to the local pressure gradient evaluated at the center of the interface. Moreover, the magnitude of velocity at an interface and the temperature within a macrocell are treated as if they depend only upon the distance from the nearest wall. Such treatment, which can be called "forced local one-dimensionalization", seems reasonable, even in the case of irregular macrocells, because the distance from the nearest wall is the most important factor influencing the temperature and velocity fields. It results in simulation accuracy that appears to be comparable to, and possibly better than, typical accuracy achievable with 2.5D modeling of the prior art.

In another major aspect of the invention, building a flow model comprises completely automated partitioning of the cavity, no matter how complex and convoluted, into coarse-grained 3D macrocells and wall conforming layers inside them. Many aspects of the invention relate to steps involved in such automated partitioning. According to one of them, a dense plurality of sampling points is generated inside the cavity to represent its geometry in the partitioning process. In another aspect, a collection of nodal points, or nodes, is selected inside the cavity, nodes being substantially equidistant from opposing cavity walls and separated from each other by distances comparable to local cavity thickness (the distance between proximate surrounding cavity walls). In another aspect of the invention, the plurality of sampling points is divided into clusters embodying the macrocells. The clusters are built as quasi-Voronoi cells around the nodes, that is, Voronoi cells defined using the notion of internal distance between points in the cavity instead of Euclidean distance. Ideally, internal distance could be defined as the length of the shortest path between the points passing entirely inside the cavity, but, in still another aspect, a more constructive definition is used to facilitate its computation. Finally, each macrocell is subdivided into a system of layers with shapes conforming to proximate cavity walls, each layer being represented by sampling points separated from the cavity walls by distances in a certain range. Volumes and thicknesses of thus constructed macrocells and layers are evaluated simply by counting sampling points in them and taking into account the density of sampling points. The relation between layer volume and layer thickness is expressed in a shape function that is used as a coefficient in one or more balance equations in automatic generation of a numerical flow model. Finally, one or more of the previously described aspects of the invention is used in simulation of fluid flow in the cavity.

Significant advantages can be obtained by improving the robustness and simplifying the use of injection molding simulation software, provided that simulation accuracy is at least comparable to the accuracy typically achievable with judicious manual setup of 2.5D flow models of the prior art that employed only flat and cylindrical elements. The software and the computer systems on which the simulation software runs can be applied to a significantly wider class of parts than the prior art techniques, so that simulations of the injection molding can be more routinely and more reliably used in the design and manufacturing of plastic parts.

The invention is a method and a system for automated generation of models for fluid flow simulation in thin cavities. Simulation of injection molding of plastic parts is just one application of the invention. The invention encompasses molding of other molten materials, such as metals. Indeed, concepts described in the specification and claims are applicable to a wide-variety of fluid flow problems, which are all included within the scope of the invention.

BRIEF DESCRIPTION OF THE DRAWINGS

FIG. 1a is a perspective view of the wall of a cylindrical cavity, showing several cylindrical elements.

FIG. 1b is a cross-section through FIG. 1a that shows layers, which are equally spaced radially, in a cylindrical element.

DETAILED DESCRIPTION OF THE INVENTION

Classical Hele-Shaw Geometries

Figure 2A:
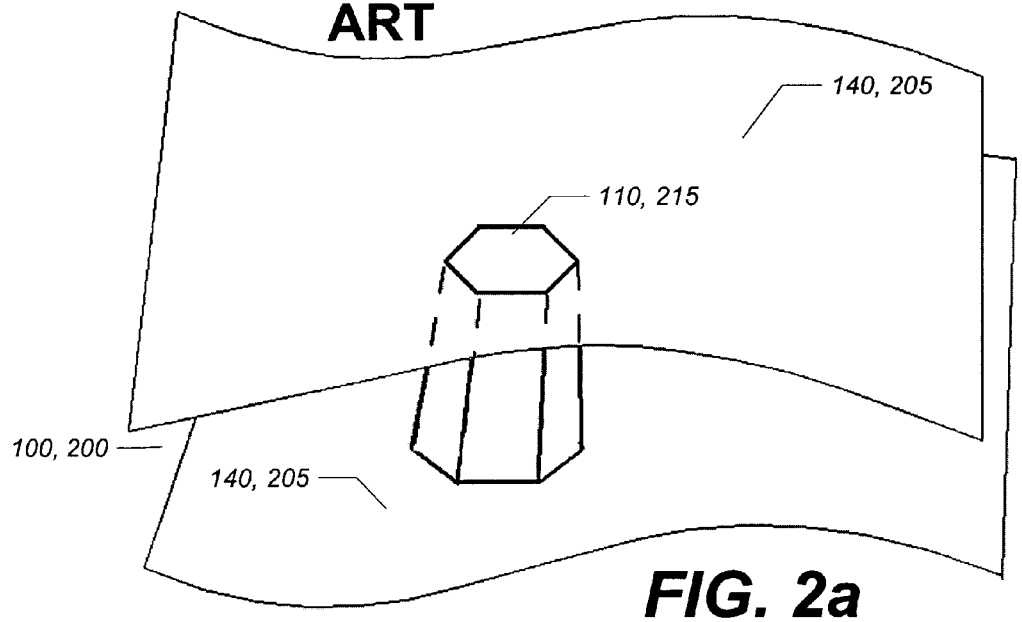
FIG. 2a is a perspective view of the bounding surfaces (walls) of a flat channel, which could be used to mold a shell-like part with gradually varying thickness, showing a typical flat spatial element.

FIG. 1a and FIG. 1b illustrate one of the two kinds of mold cavity 100 geometries that can be handled using the classical HS approximations, namely, a runner 190 shown here in the shape of a straight cylindrical cavity 180. The runner 190 is divided along its axis 120 into cells 110, specifically cylindrical cells 115. Any two adjacent cells 110 are joined at an interface 135. A cross-section 130 (FIG. 1b) shows that the cylindrical cells 115 are divided into layers 150, which are part of the discretization scheme of the model. Flow, in this case 1D flow along the axis 120 of the runner 190, will be generally parallel to the walls 140. In the i-th cell, each layer 150 has a characteristic layer thickness 155 $h_{i,k}$, where k is the layer 150 index, increasing inward from 1 in the layer closest to the wall. The layer thickness 155 of the innermost layer 160 is defined as the distance from the axis 120 to the boundary with the next layer 150. The exemplary layers 150 shown in FIG. 1b have a uniform layer thickness 155; in particular, the layer thickness 155 of the innermost layer 160 is equal to the layer thickness 155 of the outer layer 170.

Figure 2B:
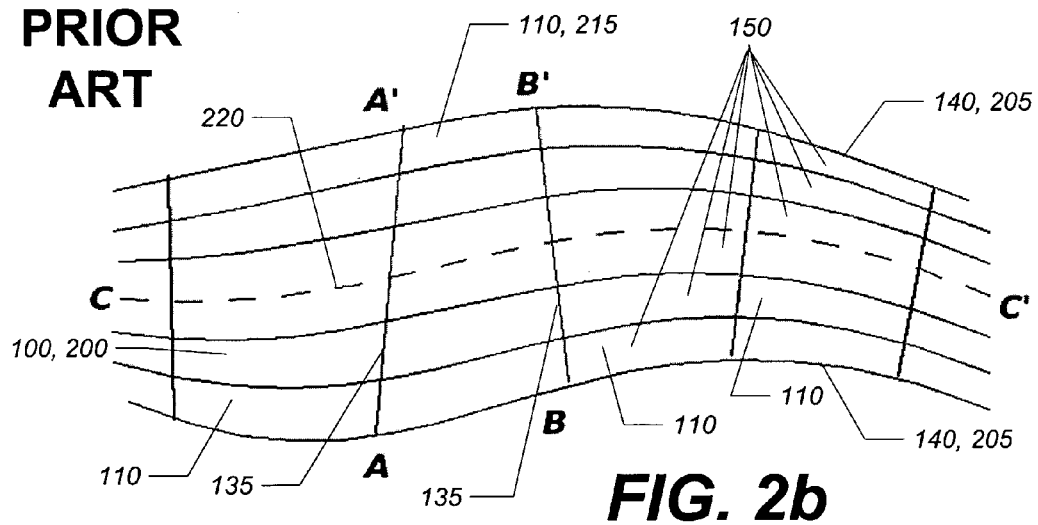
FIG. 2b is a cross-section through FIG. 2a, showing layers and the mid-plane surface in a flat element.

FIG. 2a and FIG. 2b illustrate an approximately flat channel 200, the other kind of mold cavity 100 geometry that was encompassed by the classical HS approach. In this case, the cavity 100 is bounded by two nearly flat bounding surfaces 205, slowly varying in space. Cells 110 partitioning the flat channel 200 are typified by the approximately prismatic flat cell 215 shown in FIG. 2a. There will be no flow perpendicular to the walls 140, but, in contrast to the runner 190 geometry, flow may have any direction parallel to the walls 140, and can be regarded as occurring along the midsurface 220 of the cavity 100. FIG. 2b shows the midsurface 220, the layers 150, and a cross-section through several cells 110 (separated by interfaces 135 labeled A-A' and B-B') of FIG. 2a. Note that discrete HS equations of the prior art treat the flat cell 215 as if it were an exact flat element, i.e., a straight prism.

An Embodiment of the Method of the Invention

Figure 3:
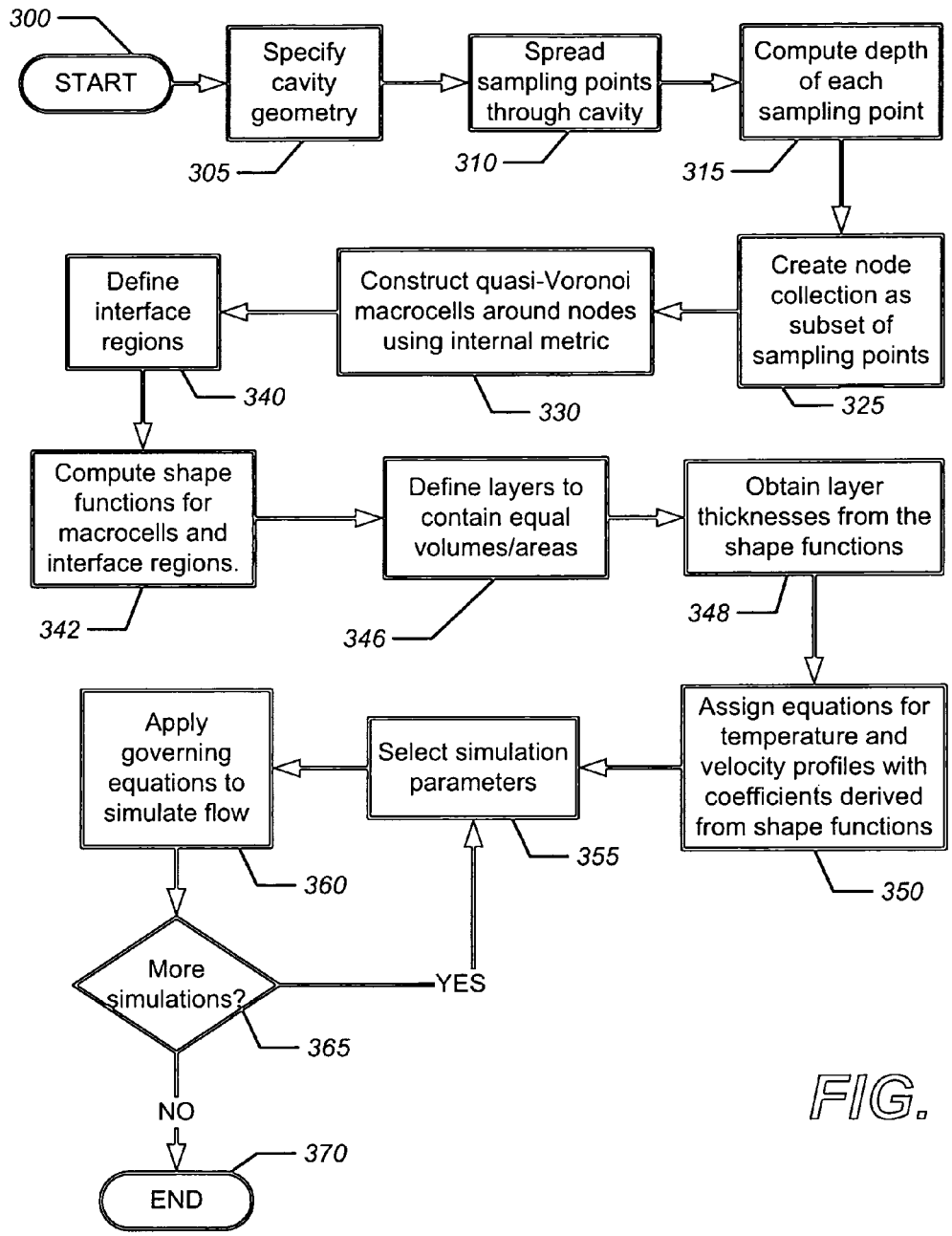
FIG. 3 is a flowchart of an embodiment of the method of the invention.

FIG. 3 is an embodiment of the method of the invention in the form of a flowchart, presented at this point as an introduction. Subsequent discussion will refer back to this figure and explain unfamiliar terminology. In the context of injection molding, the model cavity 100 is an approximation of the geometry of the real cavity that will be used to mold the part. Henceforth throughout this document, the terms cavity and model cavity should be regarded as equivalent, unless otherwise specified in a particular context of the discussion. A proposed geometry of the model cavity 100 will be specified 305 in advance as an input to the simulation software. The software will then generate 310 a dense set of points called sampling points inside the modeled cavity 100. Depending on embodiment, these points might be spread relatively uniformly throughout the cavity 100, or they might be scattered with variable density to allow the model to better capture flow behavior in thinner channels of the cavity 100.

Before proceeding with the description of the flowchart, it should be noted that, throughout the simulation, objects such as the cavity 100 and the sampling points will be represented digitally. Such digital representations might be held in computer memory, on disk, or in any other digital device. The representations might move during the simulation from one digital device to another, reside redundantly in a plurality of storage devices, or be split between two or more devices. At any given time, a representation might be, e.g., in the form of software code, distributed objects, or a database entry. These remarks about digital representation apply equally to other model objects, data, and concepts discussed throughout this specification, such as governing equations, nodes, macrocells, and field variables (mass, pressure, temperature, and velocity).

For each sampling point, its depth is computed 315. The depth is the shortest straight-line distance from the sampling point to the nearest cavity wall 140. A collection of nodes is created 325 that is, in one embodiment, a rarified subset of the set of sampling points. The depths of sampling points play a key role in creating the node collection. Around each node, a macrocell 420 is constructed 330 as a quasi-Voronoi cell. In contrast to the conventional Voronoi cells (consisting, for each node, of points that are closer to that node than to any other nodes), which are constructed using the Euclidean metric (i.e., straight-line distance), quasi-Voronoi cells are constructed using internal distance that can be defined, for any two points in the cavity, as the length of the shortest path between the points passing entirely inside the cavity (in actual computations, the paths are limited to polylines stepping over neighboring sampling points). This approach allows macrocells 420 to be relatively large without permitting them to consist of disconnected regions (which could lead to unrealistic flow "jumps" through cavity walls). Next, an interface region is defined 340 surrounding each interface 135 between adjacent macrocells. The interface regions are used to compute flow structure between adjacent macrocells 420 in order to account for mass and heat transfer between macrocells 420.

For each macrocell 420, the depths of sample points are then used to compute 342 the shape function relating the depth to the volume of the macrocell regions located farther from the cavity wall 140 than the given depth, or, in other words, under the given depth. An analogous shape function is calculated for each interface region.

Within each macrocell 420, layers 150 are defined 346 as regions consisting of points with depths in a certain range. Such layers can be called wall conforming layers, as the boundaries between them are equidistantly offset from the wall, or, in other words, are generally parallel to the walls. The offset distances, or depths, of the boundaries may be chosen using different strategies. In one of them, they are chosen so that the layers are volumetrically equal—or, expressing it more accurately, each layer 150 contains the same portion of the macrocell 420 volume (equal to 1/N, where the number of layers N is the same for all macrocells 420). Using this definition, the thicknesses of the layers can be computed 348 from the shape function of the macrocell. Layers and layer thicknesses are similarly established within each interface region.

The thicknesses and volumes of layers are used 350 in construction of appropriate model equations for the temperature and velocity profiles. Thus, the coefficients of these equations reflect the shape function specific to the individual macrocell 420 or interface region.

Finally, injection molding process parameters of the specific simulation are selected 355, and a simulation is run 360. More simulations can be run if warranted or desired 365. Otherwise, the present group of simulations ends 370.

The beauty of the approach shown in the flowchart is that it can be entirely and straightforwardly automated, regardless of the complexities of the cavity 100 geometry. The following paragraphs provide detailed description of the steps involved in automated partitioning of the cavity 100 and computation of its geometric characteristics.

Cross-Midsurface Discretization: Layers

Figure 4A:
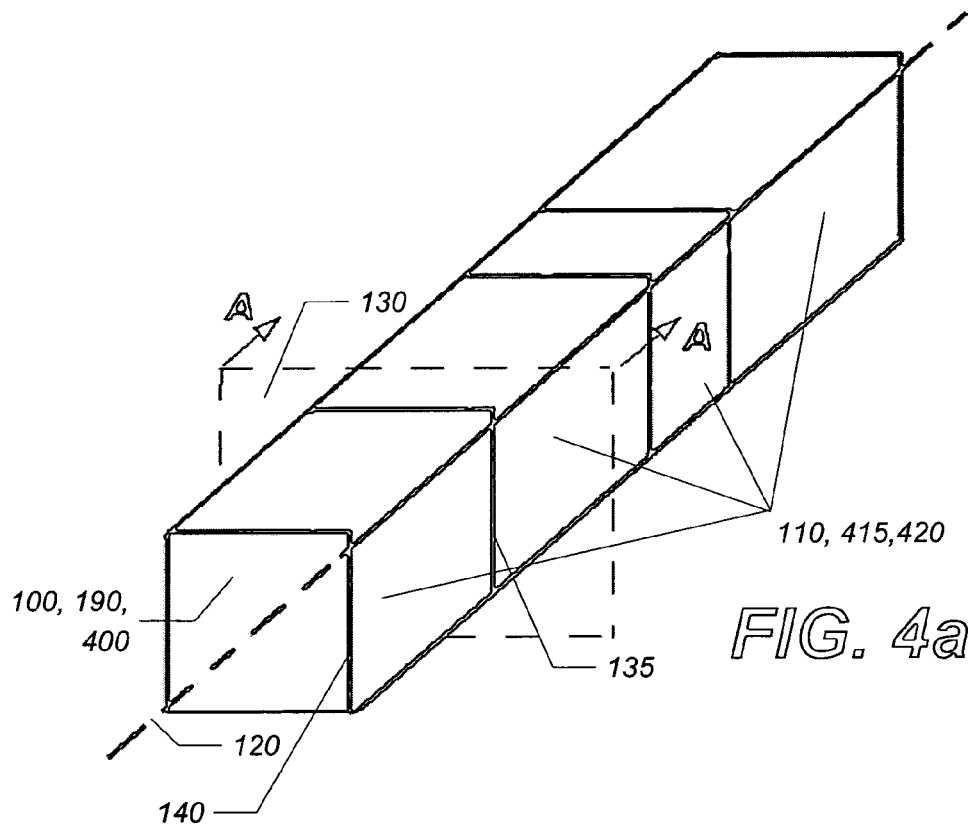
FIG. 4a is a perspective view of the walls of a rectangular (in this particular example, square) cavity, showing several macrocells.

FIG. 4a is a simple example illustrating some of the aspects of the spatial discretization scheme of the invention. The mold cavity 100 is partitioned into a plurality of 3D macrocells 420 connecting proximate cavity walls 140 and having substantial contact areas with the walls 140. As a minimum, a portion of the boundary of each macrocell will coincide with a portion of a cavity wall 140 such that the contact area where they coincide is positive. However, the contact areas should exceed the local thickness of the part squared. Large enough contact areas ensure that the shape functions of the cells and interface regions reflect well the local geometry of the cavity.

For many plastic parts, some or even most macrocells 420 built by the method of present invention may be very similar or even identical to the standard elements of the prior art. On the other hand, near the edges and rib intersections macrocells 420 will necessarily have more complex shapes. In particular, at least one macrocell 420 will be neither a flat element nor a cylindrical element. In such more complex macrocells 420, the layers 150 (and, correspondingly, the discretized equations for temperature and velocity) of the present invention are clearly distinct from those employed by the prior art based on flat or cylindrical elements.

Although the rectangular channel 400 of FIG. 4a is distinct from the two classical HS geometries, it can be handled by the DUALDOMAIN approach. In that method, a pair of opposite surfaces of the channel would each be covered by a respective finite element mesh. Flow through the channel would be modeled by DUALDOMAIN on each of these two meshes, and synchronized between them to represent the interior flow.

Figure 4B:
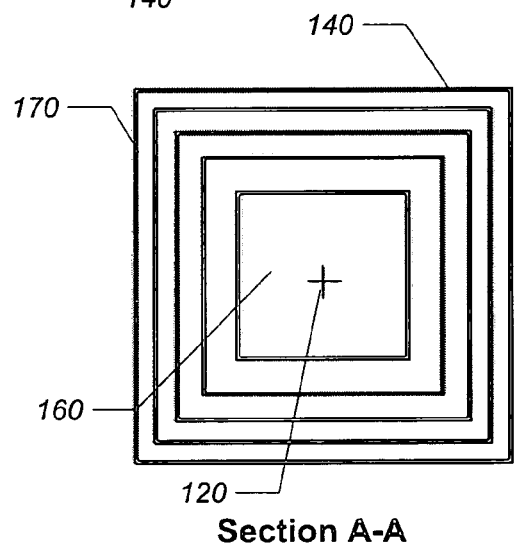
FIG. 4b is a cross-section through the channel of FIG. 4a that shows layers, each layer within a macrocell containing an equal volume.

However, the present invention is clearly distinct from DUALDOMAIN in its representation of the flow, as illustrated by FIG. 4b. As in HS flat and cylindrical elements, each macrocell 420 (which, in this case, is a rectangular channel cell 415) is explicitly subdivided into smaller spatial elements, the layers 150. Notice that in the figure the layers 150 are generally parallel to all the walls 140, being arranged in concentric squares. No special meshes are constructed upon opposing wall 140 surfaces, and, consequently, no synchronization is required.

Figure 4C:
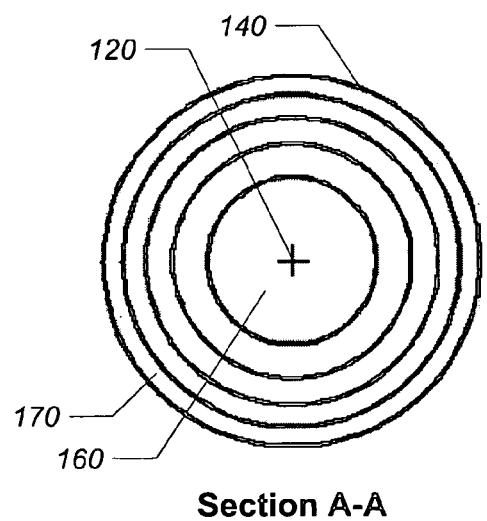
FIG. 4c is a cross-section through the channel of FIG. 1a that shows layers, each layer within a macrocell containing an equal volume, in contrast to the cross-section of FIG. 1b.

In contrast to the uniformly thick layers of FIG. 1b, one embodiment of the invention creates layers 150, wherein all layers 150 within a given macrocell 420 are volumetrically equal. For simple channel geometries such as runners 190 and rectangular channels 400, this results in inner layers 160 having layer thicknesses 155 greater than outer layers 170, as illustrated by FIG. 4b. For more direct comparison with FIG. 1b, a partitioning of a macrocell 420 from FIG. 1a into layers 150 having equal volumes is shown in FIG. 4c.

Along-Midsurface Discretization: Macrocells

In one implementation of the invention, the partitioning of the cavity 100 into macrocells 420 is performed by first constructing inside the cavity 100 a suitable collection of nodes 1000, and then forming around each node 1000 a quasi-Voronoi cell 1020 to serve as the macrocell 420 corresponding to the node 1000. For a flat channel such as that of FIG. 2a and FIG. 2b, an example of the nodes 1000 and corresponding quasi-Voronoi cell 1020 shapes will be discussed below in connection with FIG. 10.

The quasi-Voronoi cells 1020 are a variant of Voronoi cells constructed using a certain metric, discussed below, that is more appropriate to geometries such as thin channels or flow around islands than the Euclidian metric. By the term metric we mean a specification of how the distance between two points is calculated. Thus, the Euclidean metric specifies that the distance between two points is calculated as the length of the straight line between them.

To produce quasi-Voronoi cells having substantial contacts with, and thus connecting, the proximate opposing walls 140, the nodes 1000 have to be sufficiently separated from each other. When opposing walls 140 bound the cavity 100, it is desirable to construct nodes 1000 such that each is substantially equidistant from the opposing walls 140. In this case, the collection of nodes 1000 can be regarded as located at or near the midsurface 220. Similarly, when the cavity 100 is tubular, then the collection of nodes 1000 can be regarded as arranged along the axis 120. In general, an aspect of the invention is the use of macrocells 420 for along-midsurface discretization, and layers 150 for cross-channel discretization.

Generation of Sampling Points and Calculation of Their Depths

Figure 5:
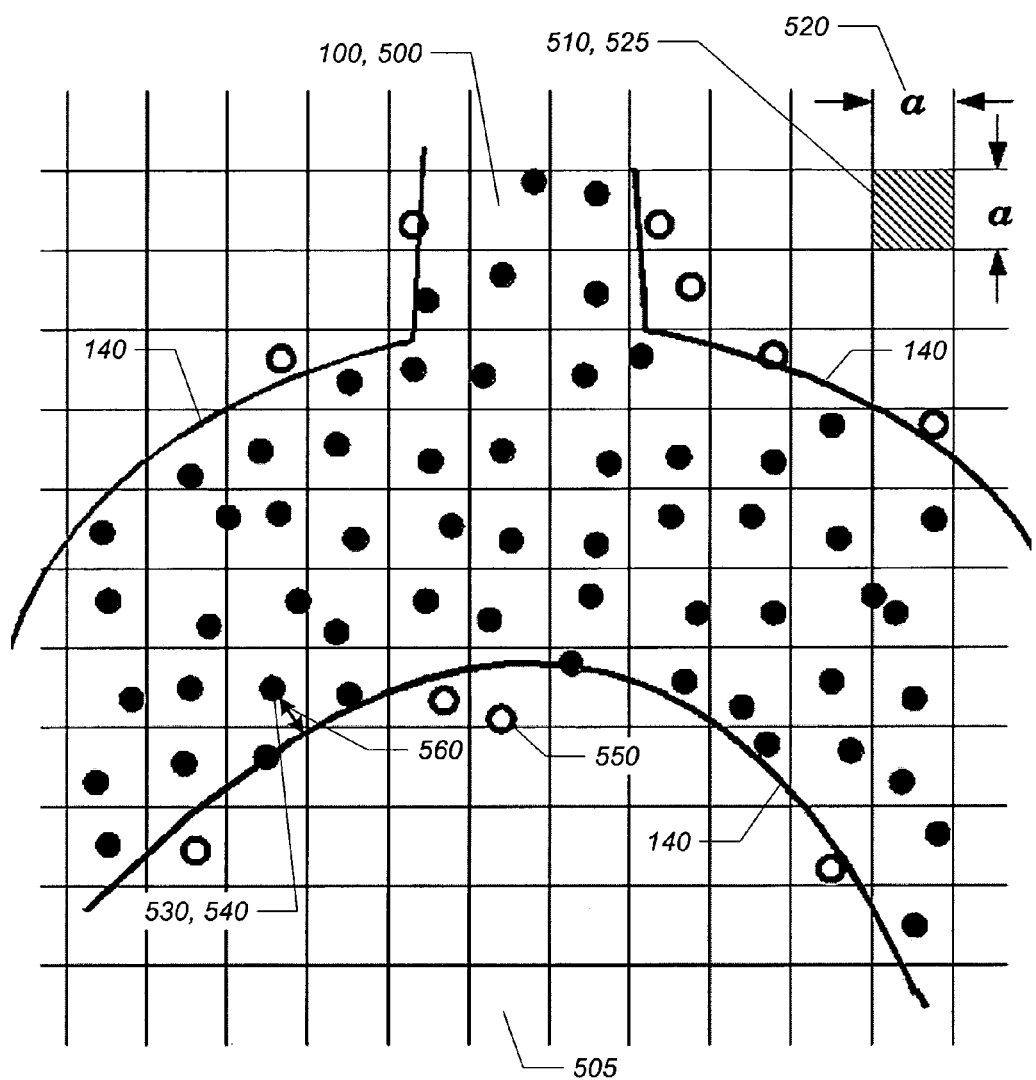
FIG. 5 shows gridcells covering a 2D cavity, each gridcell that contains some portion of the interior of the cavity including either an interior sampling point candidate or an exterior sampling point candidate.

To construct the macrocells 420 and layers 150, an embodiment of the invention uses a plurality of sampling points 530 densely scattered inside the cavity 100 as a proxy representing the shape of the cavity. A set of viable sampling points 530 can be generated in many different ways. FIG. 5 illustrates one convenient method for distributing sampling points 530 using the example of a portion of a cavity 100. Like many of the figures to follow, the channel has been chosen to be 2D for the purpose of illustrating a concept that extends straightforwardly to a 3D context. Such use of 2D examples to illustrate concepts applicable to 3D geometries is not a limitation of the invention, but rather an attempt to communicate concepts that would be more difficult in 3D to present in the drawings and to understand. Another simplification in FIG. 5 and a few other figures, made for the purposes of illustrating concepts fundamental to the invention, is that the density of sampling points shown within the cavity 100 is significantly reduced compared to that used in practice.

In the method for distributing sampling points 530 depicted by FIG. 5, a grid 505 is first imposed upon the cavity 100. Because the channel is 2D, each gridcell 510 is a square. The gridcell width 520 a is chosen to be several times smaller than the minimal thickness of those features of the cavity 100 that are essential for the injection molding simulation. Within each gridcell 510 that possibly overlaps with the interior of the cavity 100, a point is selected using a standard random number generator. The point is then analyzed against the geometry of the cavity walls 140 to determine whether it is located inside or outside the cavity 100. Each interior point 540 (typified in the figure by a labeled solid circle) is included in the set of sampling points 530, while each exterior point 550 (typified in the figure by a labeled hollow circle) is not.

A word about reference numbers in the diagrams is in order at this juncture. When the number of similar objects is large within any given diagram, it would be distracting to the reader and obscure the purpose of the drawing to label all of them with reference numbers. Thus, we will typically label one, or only a few, objects typifying a class of such objects in the drawings without further explanation.

For the more realistic geometry of a 3D cavity 100, each gridcell 510 will be a cube rather than a square, but otherwise the method described above generalizes straightforwardly. The total number of sampling points 530 in the cavity 100 is typically in the range of $10^6$-$10^7$. As will be readily recognized by persons versed in the art, the geometric computation required to determine whether a point is inside or outside the cavity is rather straightforward if, as is often convenient, the cavity walls 140 are triangulated, i.e., represented by a set of triangular facets neighboring with each other on common edges.

The described process creates sampling points 530 that are randomly and statistically uniformly distributed in a 3D cavity 100 with a density equal to one point per gridcell 510 volume $a^3$. The volume of a region inside the cavity 100, such as the volume of a quasi-Voronoi cell formed around a node 1000, can be evaluated by multiplying the number of sampling points 530 within the region by the gridcell 510 volume $a^3$. To better represent a complex cavity 100 with a broad range of local thicknesses, a nonuniform distribution of sampling points 530 can also be generated. In another embodiment of the invention, more than one sampling point 530 is randomly selected in gridcells 510 located in or near thinner portions of the cavity 100, and the volume evaluation algorithm based on counting sampling points 530 is modified accordingly. For simplicity, however, only statistically uniformly distributed sampling points 530 are considered in the following discussion.

During the process of distributing sampling points 530 it is convenient to compute the minimal distance between each sampling point 530 and the cavity walls 140, called the depth 560 of the sampling point 530. In fact, the calculation of depth 560, which is step 315 in FIG. 3, might have already been done incidentally in the course of computation required to exclude exterior points 550 from the set of sampling points 530. The depth 560 of the labeled interior point 540 is indicated in FIG. 5. Whenever depth 560 happens to be calculated, it can be retained in digital form associated with the respective sampling point 530.

In another embodiment, we generalize the concept of gridcells by superimposing on the cavity a set of 3D sampling cells. These sampling cells might, for example, be rectangular solids, or they might be small tetrahedra as in a finite element mesh. Each sampling cell contains a sampling point, located either randomly or deterministically. The concept of gridcell 510 volume in a gridcell straightforwardly generalizes to a sampling volume in a sampling cell.

Selection of Nodes

Figure 6:
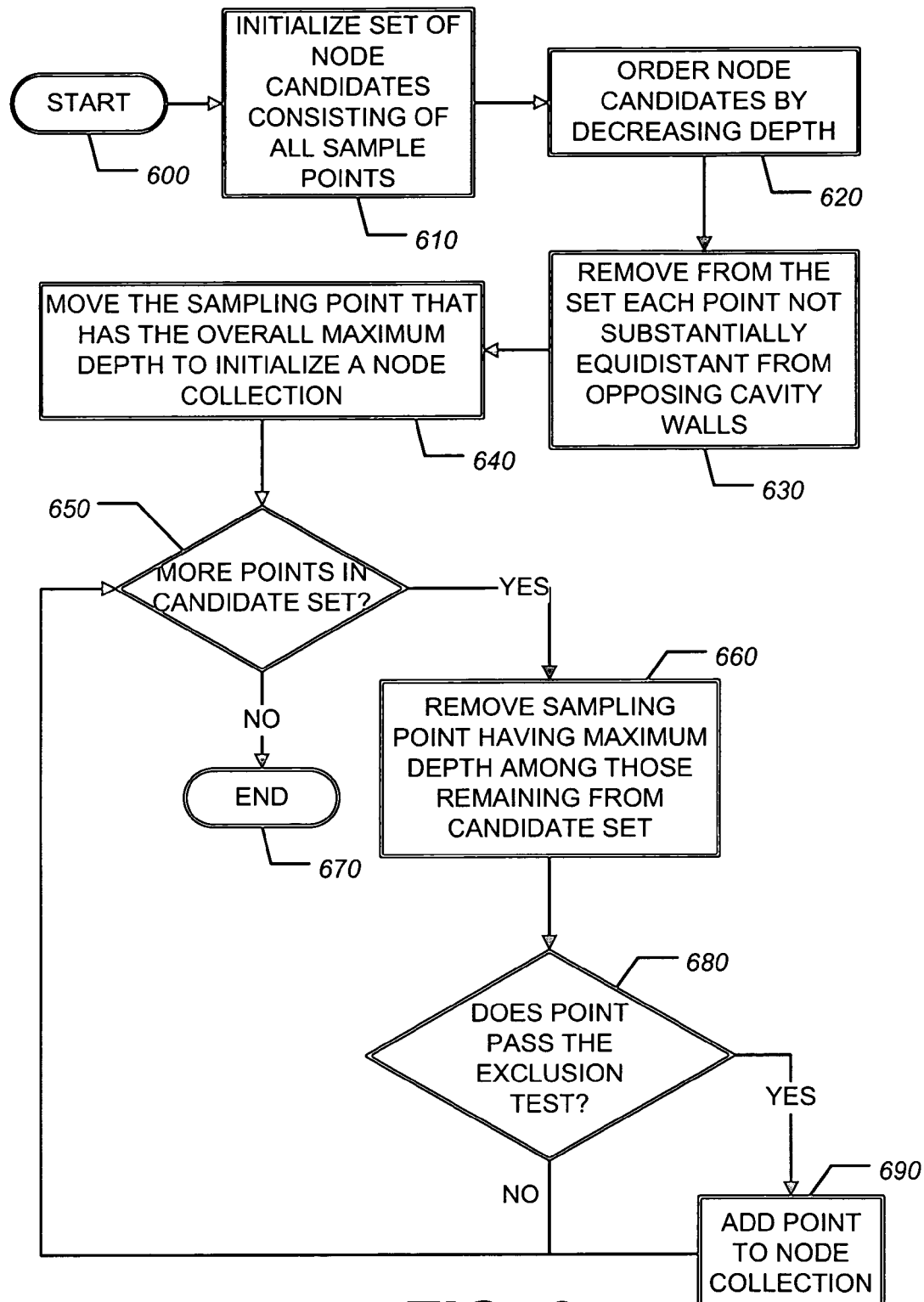
FIG. 6 is a flowchart illustrating the process of selecting a node collection from the set of sampling points.

FIG. 6 is a flowchart illustrating how the set of sampling points 530 is rarified to produce a node 1000 collection in one embodiment of the invention. FIG. 6 is a particular embodiment of step 325 of FIG. 3. At the start 600 of this process, a set of node candidates is initialized 610 to be equal to the set of sampling points 530. The node candidates are then ordered 620 by depth.

Each node candidate that is not substantially equidistant from opposing cavity walls is then eliminated 630. The test for substantial equidistance involves the concept of sampling points that are close neighbors 710, which will be explained in the following paragraph.

Figure 7:
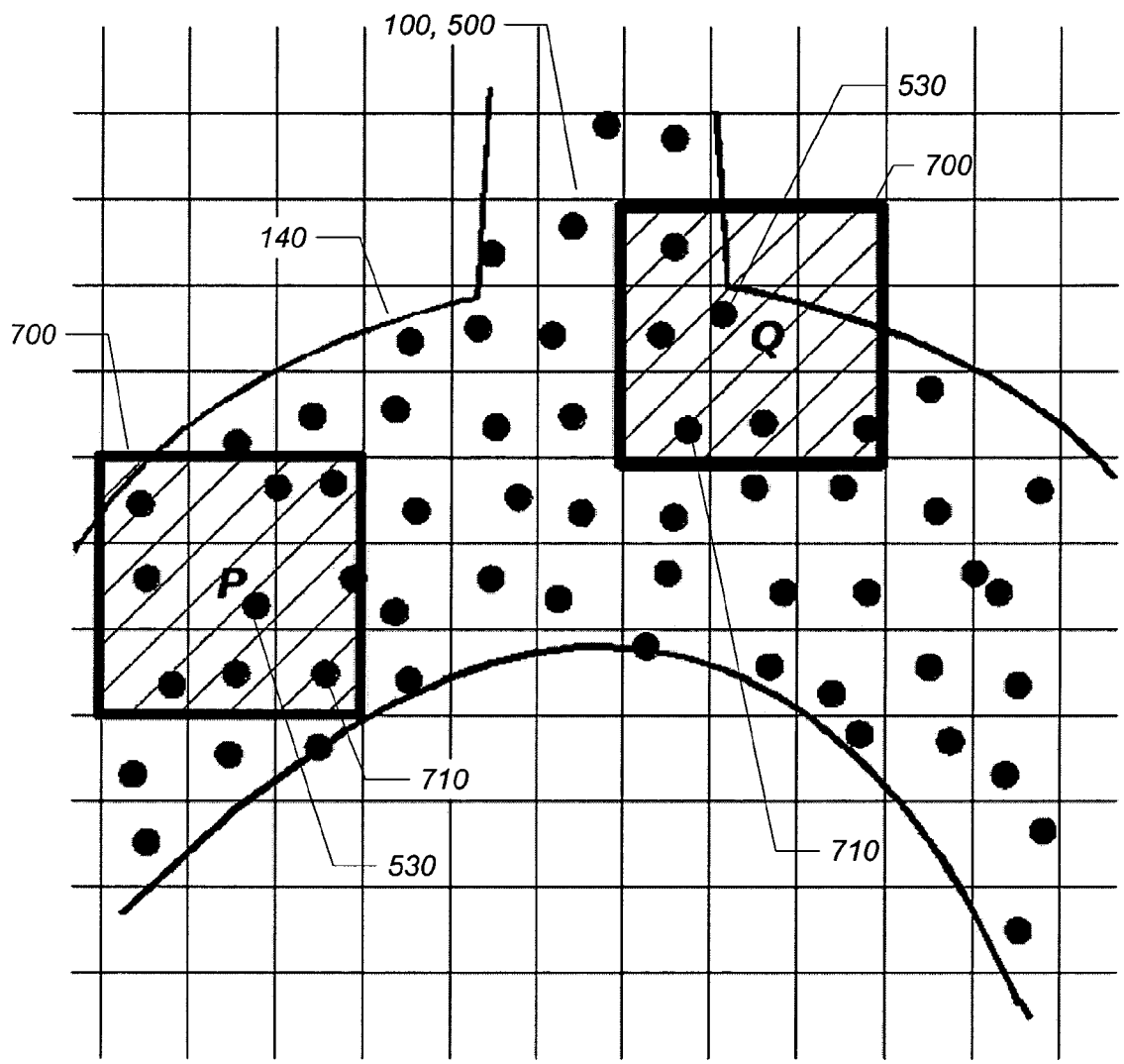
FIG. 7 is a drawing of a 2D channel showing how a nearby wall can reduce the number of close neighbors of a given sampling point.

In one embodiment of the invention two sampling points 530 are considered close neighbors 710 if they belong to adjacent gridcells 510, where gridcells 510 are considered adjacent if they have a common face, a common edge, or a common vertex. FIG. 7 illustrates, in a 2D cavity, the adjacent gridcells 700 of each of two sampling points 530 labeled P and Q. In the 2D context, a gridcell 510 and its adjacent gridcells 700 form a 3 by 3 square. Thus, in a 2D cavity 100, a sampling point 530 has at most $3^2-1=8$ close neighbors 710. One typical close neighbor 710 for each of sampling points 530 P and Q, respectively, is shown in FIG. 7. Note that P, located near the middle of the cavity 100, has a full complement of 8 close neighbors 710. Point Q, located near a wall, has only 5. In a realistic 3D cavity 100 (not shown), a gridcell 510 and its adjacent gridcells 700 form a cube that is 3 units on a side. Thus, in 3D, each sampling point 530 has no more than $3^3-1=26$ close neighbors 710.

To identify sampling points 530 that are substantially equidistant from opposing cavity walls, one embodiment of the invention applies the following simple test: a sampling point 530 P having depth $d_P$ is marked as substantially equidistant from opposing walls if (1) P has full complement of 26 close neighbors 710; and (2) P is deeper than any of its close neighbors 710 $P_i$ having depth 560 $d_i$; i.e., $d_P > d_i$, i=1, ..., 26. Any sampling point 530 that is not sufficiently close to the midsurface 220 is filtered out 630 from the set of node candidates by the test.

Figure 8:
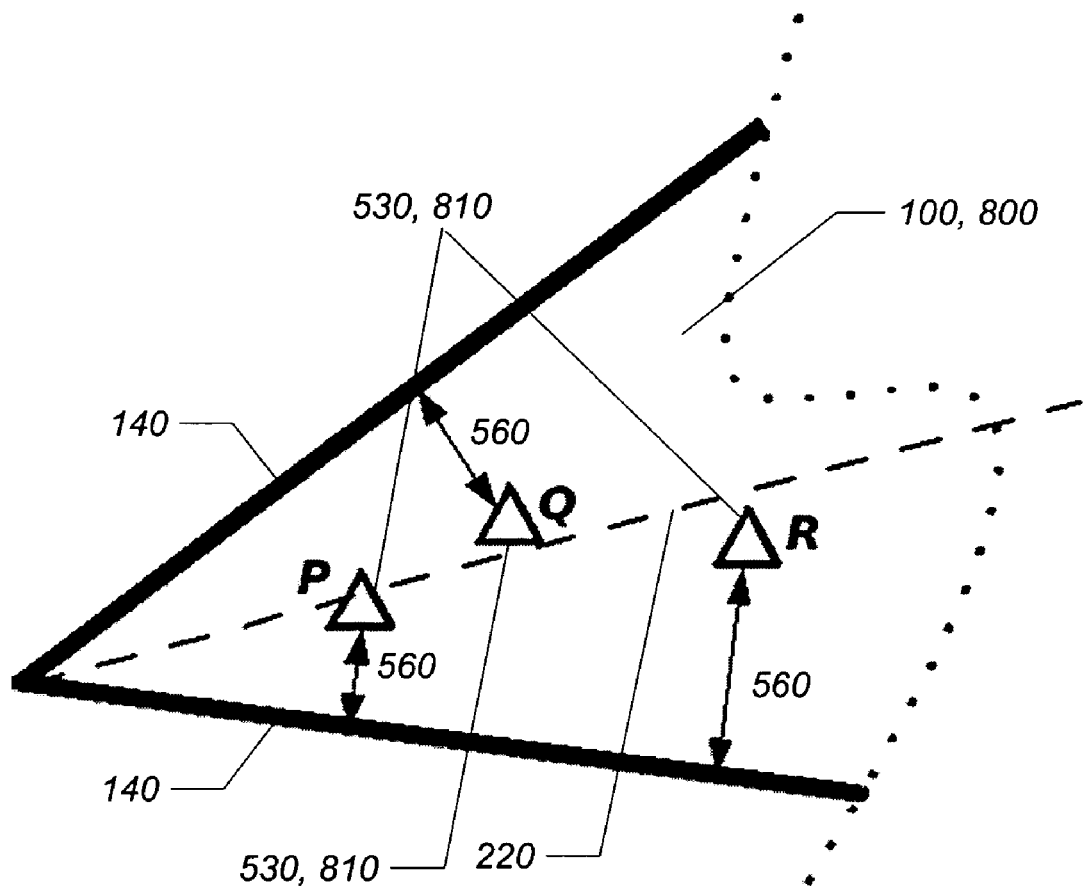
FIG. 8 is a cross-section through a strongly tapered channel used to illustrate why such portions of the cavity will contain no nodes.

Even a sampling point 530 that is located on, or very close to, the midsurface 220 of a strongly tapered channel is likely to be filtered out by the test, because such points are more likely to have at least one close neighbor 710 $P_j$ having depth 560 $d_j > d_P$, due to the fact that $P_j$ is located where the channel is wider. This situation is illustrated in FIG. 8 (another 2D illustration of a concept that applies equally well in 3D), where three node candidates 810, labeled P, Q, and R, are shown, along with their respective depths 560. Each of these sampling points 530 is close to the midsurface 220 of the tapered channel 800. We will assume that P is a close neighbor 710 of Q, which, in turn, is a close neighbor 710 of R. It will be observed that P will be eliminated as a node candidate 810 because Q has a greater depth 560. Similarly, Q will be eliminated by R, whose depth 560 is greater still, and so forth within the strongly tapered region of the channel. Screening sampling points 530 in strongly tapered channels 800 avoids the creation of numerous minute cells 110 in the corners of the cavity 100 that would touch two or more faces intersecting at an edge or at a vertex of the molded part.

In another embodiment of the invention, the test described above is modified so as to filter out more sampling points 530, particularly those in the strongly tapered channels. A sampling point 530 passes the modified test if, for any of its close neighbors 710 $P_i$, $$d_P > d_i + \epsilon \operatorname{dist}(P, P_i), i=1, \ldots, 26,$$

where dist(P, $P_i$) is the distance between P and $P_i$, and $0 < \epsilon < 1$ is a preselected constant. Values of $\epsilon$ in the range [0, 0.3) have been tried and have produced acceptable sets of candidate points.

Returning to the flowchart of FIG. 6, we see that the next step in the node 1000 selection method is to initialize 640 a node collection with that node candidate 810 having the maximum depth 560 (i.e., located in the thickest portion of the cavity 100). Whenever a point is added to the node 1000 collection, it is removed 660 from the set of node candidates 810.

The node 1000 collection will be grown by subjecting, in the order of decreasing depths 560, each sampling point 530 surviving as a node candidate to an exclusion test that compares the candidate to each node 1000 already included in the node collection. A node candidate 810 passes the exclusion test with respect to a node 1000 already in the collection if the Euclidean distance between the point and the node 1000 exceeds a preselected exclusion distance. In order to be added to the node collection, the node candidate must pass 680 the exclusion test with respect to each node 1000 already in the node collection. After all node candidates 810 have been examined 650, the node collection is complete 670.

The purpose of the exclusion test is to avoid the occurrence of nodes 1000 that are too close to each other. If nodes 1000 are too close, quasi-Voronoi cells 1020 may be formed having insufficient contact areas with the opposing cavity walls 140, possibly having just one contact or even no contact at all. The exclusion distance of a candidate point with depth 560 $d_1$ with respect to a node 1000 having depth 560 $d_2$ may be defined by any suitable function of $d_1$ and $d_2$, and possibly of other parameters; in one embodiment, the exclusion distance is defined as $$d_{exc}=E_1 \max(d_1,d_2)+E_2 \min(d_1,d_2),$$

where exclusion factors $E_1$ and $E_2$ affect the number of macrocells 420 in the cavity 100 partitioning. These factors can be hardwired or controlled by the investigator, but in most cases should not be smaller than 1. Typically, $E_1$ can be selected between 1 and 1.5, and $E_2$ between 1 and 4. The number of nodes 1000 in lean flow models of the present invention may vary widely, depending on the part geometry and the selected value of exclusion factors, but usually these factors can be selected within the above defined ranges so that the total number of nodes 1000 is between 100 and 1000.

Internal Distance Defined

With the sampling points 530 and nodes 1000 now selected, we note that the next step in the invention embodiment described by the overview flowchart of FIG. 3 is to construct 330 quasi-Voronoi cells 1020, each quasi-Voronoi cell 1020 having a respective node 1000 as its nucleus. In one embodiment of the invention, the quasi-Voronoi cell 1020 surrounding a node 1000 is represented by those sampling points 530 that are closer, in a certain metric, to that node 1000 than to any other node 1000 in the collection. Thus, macrocells 420 are defined similarly to standard Voronoi cells, except that a non-Euclidean metric called internal distance is used in the definition. The advantage of using internal distance will be explained shortly.

Figure 9:
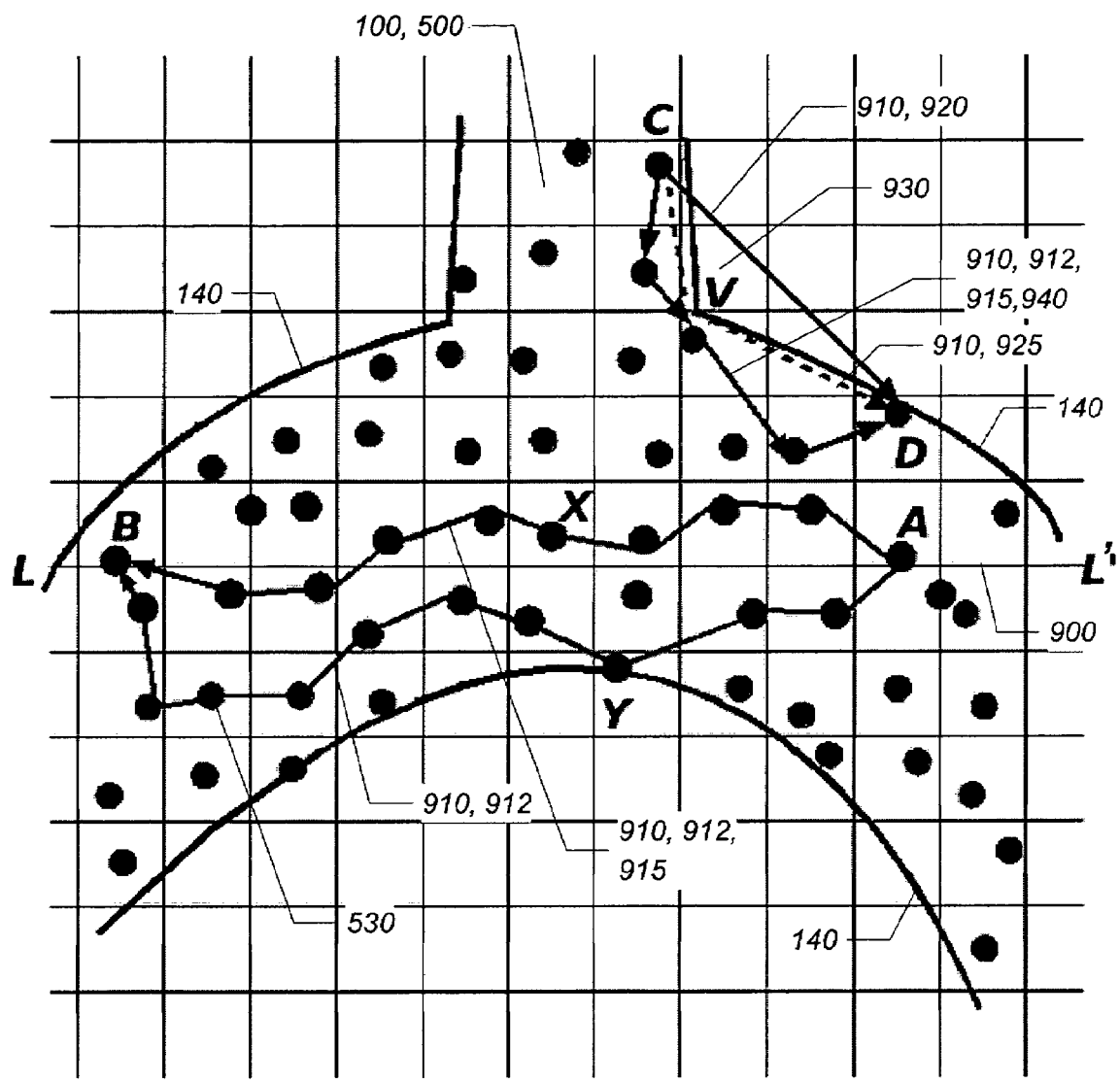
FIG. 9 contrasts Euclidean distance in a 2D channel with internal distance obtained by shortest polyline path for each of two pairs of sampling points.

In FIG. 9, two sampling points 530, labeled A and B respectively, are located in the cavity 100 along grid line L-L' 900. Two paths 910 are shown from A to B, formed by straight line segments connecting sampling points 530 that are located generally between A and B. In the embodiment of the invention illustrated by the figure, each straight line segment must connect sampling points 530 that are close neighbors 710, as described in connection with FIG. 7. (In general, the segments participating in a polyline path 912 remain inside the cavity walls 140.) Because the polyline path 912 passing through the point labeled X is shorter than any other polyline path 912 from A to B, including, e.g., that polyline path 912 through the point labeled Y in the figure, polyline path 912 A-X-B is the shortest polyline path 915 from A to B. Note that the length of the shortest polyline path 915 between two points will be greater than or equal to the Euclidean distance between them due to its meandering around the exact shortest path. For example, the Euclidean distance between A and B will be the length of the straight line path 920 between A and B along grid line L-L' 900.

Two other sampling points 530, labeled C and D respectively, are located near a "blind" intersection of two portions of the cavity 100 in FIG. 9. In this case, the straight line path 920 between the two points is mostly outside the walls 140 of the cavity 100, while the shortest polyline path 915 is, by definition, entirely confined to the interior of the cavity.

Ideally, the internal distance between two points in the cavity 100 could be defined as the length of the shortest path 910 connecting the points and passing entirely inside the cavity 100. In FIG. 9, the internal distance would be the length of the shortest internal path 925, shown dashed from C to D through the vertex V located on the wall 140, and consisting of two straight line segments. In contrast to the internal distance from A to B, which, in this case, is the same as the Euclidean distance, the internal distance from C to D is larger than the Euclidean distance. Between any two points in the cavity 100, the internal distance will always be greater than or equal to the Euclidean distance, and the length of the shortest polyline path 915 will always be greater than or equal to the internal distance.

FIG. 9 demonstrates the concepts of internal distance using a 2D cavity. Again, these concepts extend straightforwardly to 3D cavities.

Because of high computational complexity involved in computation of the exact internal distance in an intricately shaped cavity 100, an embodiment of the invention uses the shortest polyline path 915 length to obtain an approximation for the exact internal distance, and attempts to compensate for the increase in the length due to meandering of polyline paths by applying a correction factor. The value of the correction factor is evaluated by dividing the length of the shortest polyline path 915 between two not too close points visible from each other by the Euclidean distance between the points, and averaging the ratio over a number of pairs of such points. Henceforth in this description of the invention, the term internal distance may refer to exact internal distance or a proxy, depending upon embodiment.

Partitioning Sampling Points into Quasi-Voronoi Cells

With the concept of internal distance defined, we are ready to elaborate upon one embodiment of step 330 of FIG. 3. For each sampling point 530, several nearby nodes 1000 are selected. Internal distance may be used in identifying which nodes 1000 are considered "nearby," but Euclidean distance will routinely suffice for this particular purpose.

The internal distance from the sampling point 530 to each of the nearby nodes is evaluated. In one embodiment of the invention, each sampling point 530 is included in the macrocell 420 formed around the node 1000 that is nearest with respect to the internal distance.

Technically, the invention partitions a cavity 100 into macrocells 420 having substantial contact with opposing walls 140. One method of doing so is to define quasi-Voronoi cells 1020, and then identify the macrocells 420 with the quasi-Voronoi cells 1020. Furthermore, one method of defining a quasi-Voronoi cell 1020 is to find a cluster of sampling points representing the quasi-Voronoi cell 1020. In the following discussion, however, the terms macrocell 420 and cluster representing the quasi-Voronoi cell 1020 are assumed to have essentially the same meaning and may be used interchangeably.

In another embodiment of the invention, the definition of the quasi-Voronoi cells 1020 is modified so that internal distances from a sampling point 530 to the nearest nodes 1000 are multiplied, before being compared, by weight factors inversely proportional to the depths 560 of the nodes 1000. In this embodiment the interface 135 between two nodes 1000 is closer to the one having smaller depth 560 (for example, located in a narrow channel near its connection with a wider channel). The following discussion, however, focuses on the embodiment in which the definition of quasi-Voronoi cells 1020 does not involve weight factors.

Figure 10:
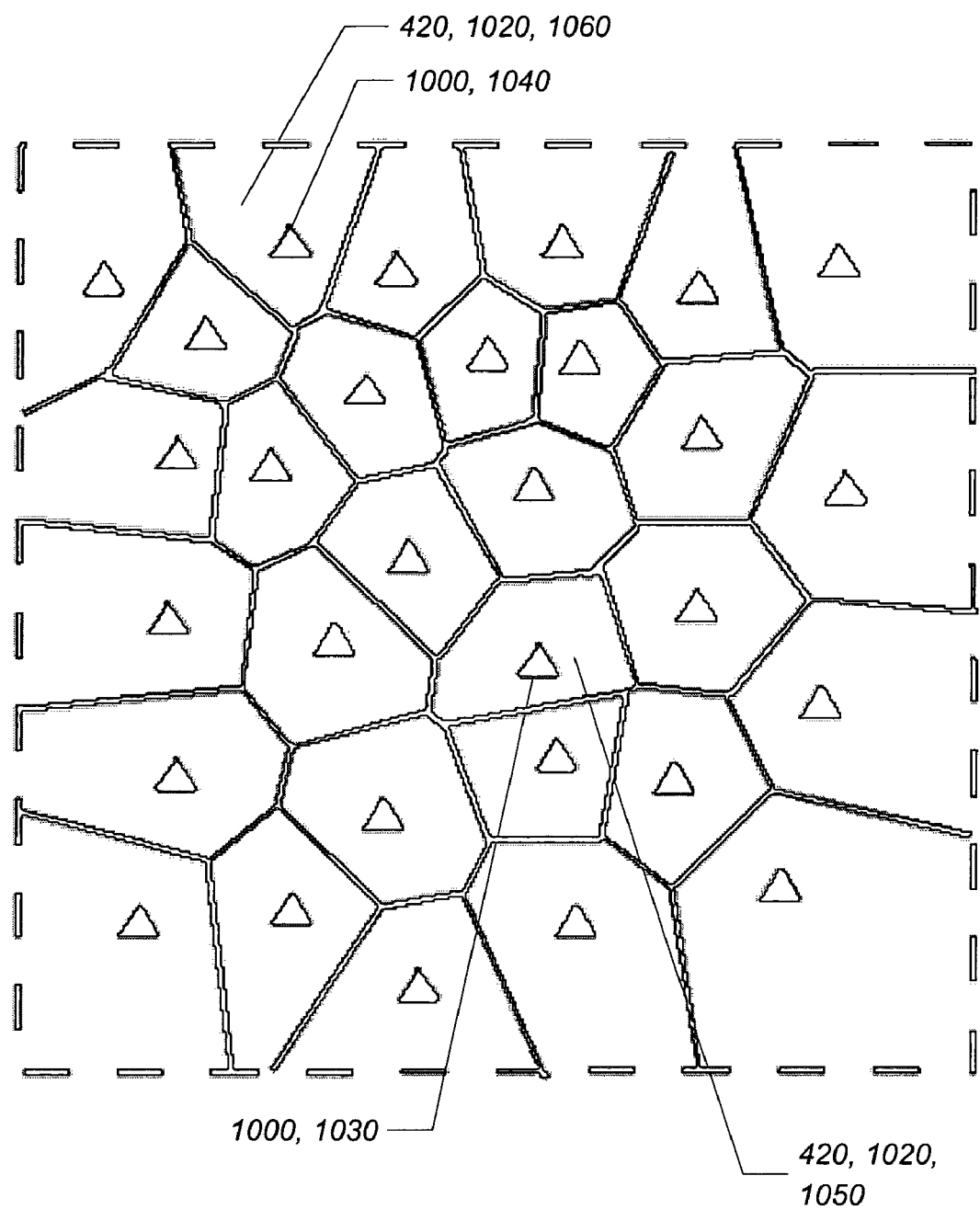
FIG. 10 is a view from above a portion of a bounding surface of a flat channel showing several quasi-Voronoi cells and their respective nodes.

In many portions of a typical cavity 100, the quasi-Voronoi cells 1020 produced by the process of FIG. 3 will be standard Voronoi cells. FIG. 10 shows quasi-Voronoi cells 1020 that would result from some nodes 1000 found in a thin square cavity. The inside quasi-Voronoi cell 1050 associated with an inside node 1030, both labeled in FIG. 10 with reference numbers, and its neighboring cells 110 typify the kind of arrangement of prismatic macrocells 420 that would be expected in a cavity 100 between two slowly varying surfaces away from walls 140, as shown in FIG. 2a and FIG. 2b, when viewed from above the upper surface. The shapes of quasi-Voronoi cells 1020 along the dashed outside boundary of the figure, typified by the labeled outside node 1040 and outside quasi-Voronoi cell 1060, would not be unusual for macrocells 420 found near walls. Such macrocells have a contact with the edge wall, in addition to the contacts with the proximate opposite walls. The layers in such macrocells are conforming to more than two proximate walls.

In one embodiment of the model, a quasi-Voronoi cell 1020 is defined by the sampling points 530 it comprises. In this case, the interface 135 between adjacent quasi-Voronoi cells 1020 will actually be somewhat geometrically fuzzy, the fuzziness decreasing as the density of sampling points 530 is increased.

Figure 11:
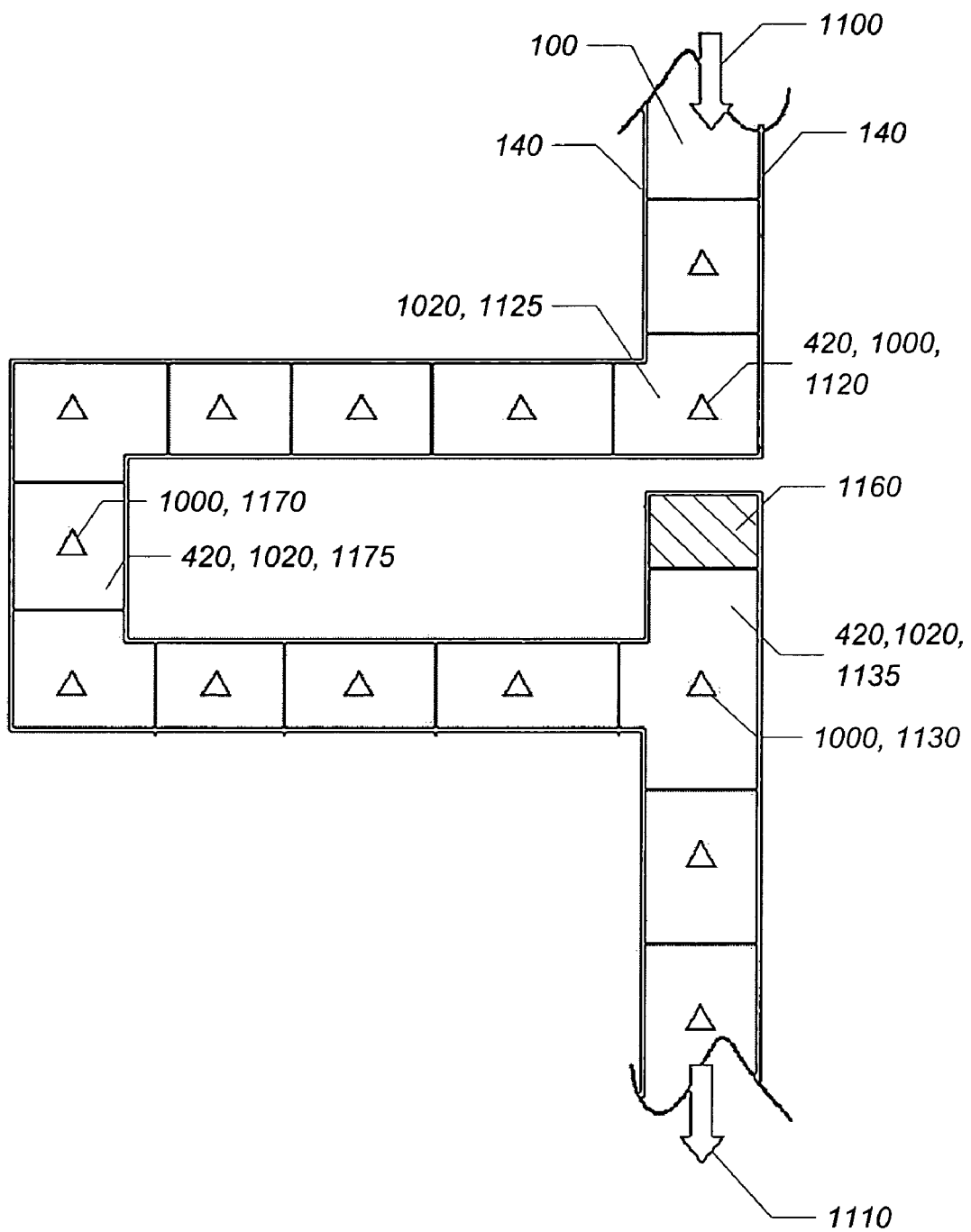
FIG. 11 is a 2D channel demonstrating that the use of the Euclidean distance metric to define macrocells can result in unrealistic flows which can be avoided by the use of internal distance.

FIG. 11 demonstrates with a 2D example the usefulness of internal distance in automating the partitioning of a cavity 100 into macrocells 420. The molded part here will include a somewhat convoluted channel section. Flow of resin will enter this section at the arrow indicating inflow 1100 and exit at the arrow indicating outflow 1110. The channel is partitioned into macrocells 420, each macrocell centered on a node 1000. At issue is whether the hatched region 1160 should belong to the upper macrocell 1125 centered on the upper node 1120, or to the lower macrocell 1135 centered on the lower node 1130.

Using Euclidean distance, points within the hatched region 1160 are closer to the upper node 1120 than to the lower node 1130, and thus would be considered part of the upper macrocell 1125. Under this configuration, upon entering the upper macrocell 1125 resin from above would fail to mind the gap and would enter the lower macrocell 1135, without ever having passed through the 'C'-shaped segment of the channel to the left that includes the intermediate macrocell 1175 centered on the intermediate node 1170. The C-shaped channel segment would fill through both its upper and lower branches at the same time, and flow would begin to exit at the arrow indicating outflow 1110 prematurely.

This entirely unrealistic behavior, almost sure to produce unreliable simulation results, is avoided using internal distance in partitioning the cavity 100 into macrocells 420, because the shortest internal path 925 and the shortest internal polyline path 940 will necessarily pass through the intermediate macrocell 1175 and the other macrocells 420 within the C-shaped channel segment. Points in the hatched region 1160 are regarded as far away, according to internal distance, from the upper node 1120, and closer to the lower node 1130 than to any other node 1000.

Interface Regions

Figure 12:
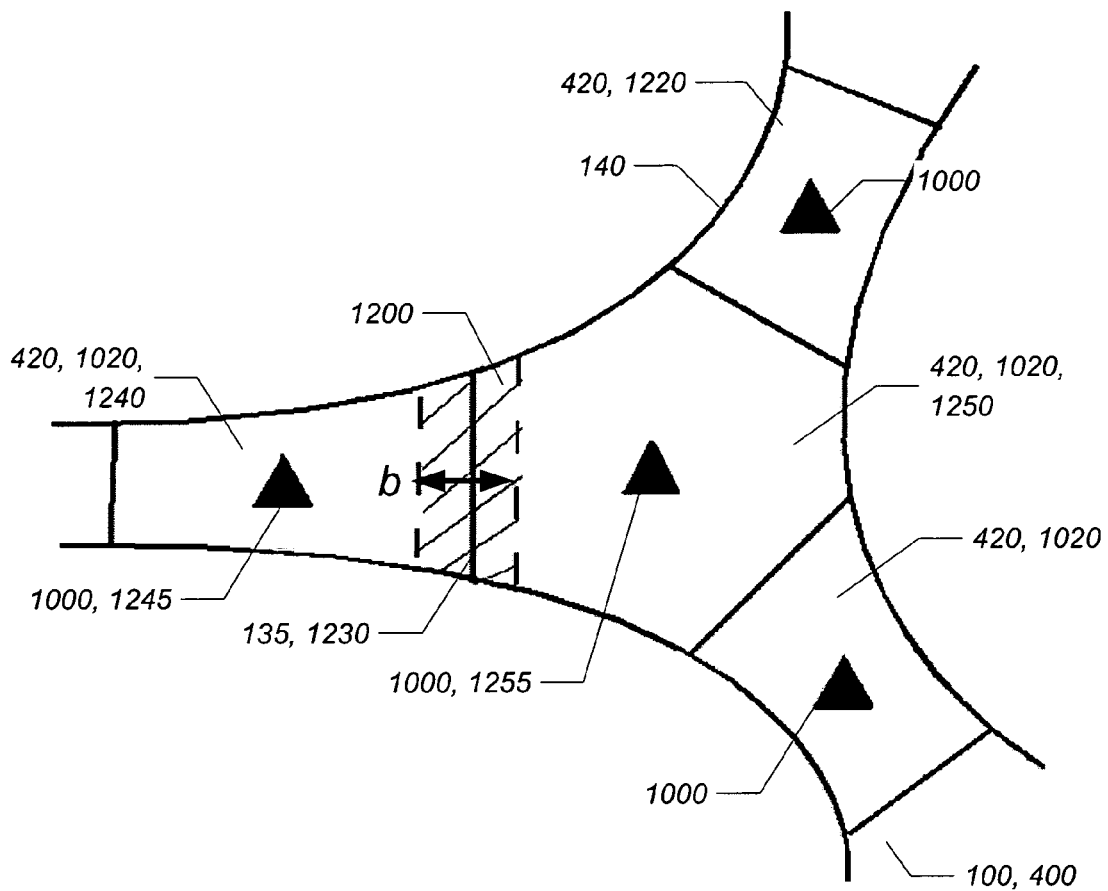
FIG. 12 is a 2D model cavity illustrating a macrocell located at the confluence of three channels that has substantial contact with opposing walls, and also illustrating an interface region.

To formulate the balance equations, certain field variables in the model must be calculated at interfaces 135 between macrocells 420. For this reason, it is convenient to define an interface region 1200 between each pair of adjacent macrocells 420. FIG. 12 is a 2D illustration of the interface region 1200 concept that extends straightforwardly to 3D.

Located within the confluence of three channels, the macrocell 1250 is interesting in its own right. While still having a relatively simple geometry, the macrocell 1250 centered upon the node 1255 illustrates how the invention can automatically accommodate complex branching cavity 100 shapes. Note that the macrocell 1250 is in substantial contact with three opposing proximate walls (rather than one as in the case of a 3D cylindrical element 115, or two as in the case of a 3D flat element). It is easy to imagine a 3D part that has several channels of various shapes converging in a single area, and a macrocell 420 situated within the intersection in substantial contact with many opposing walls.

An interface region 1200 is shown in FIG. 12 that contains the interface 135 itself. The interface region is situated between a labeled left macrocell 1240, centered on a left node 1245, and the central macrocell 1250, centered on a central node 1255. The width b of the interface region 1200 is shown in the figure. There are a number of ways to define an interface region 1200, each of which is an embodiment of the invention. The definition chosen in a particular model implementation of interface region 1200 will dictate its geometry, and, in particular, its width.

In one embodiment, if the percentage difference of internal distances of a sampling point 530 to each of its nearest and second nearest nodes 1000 is small enough—e.g., smaller than some preselected threshold, typically between 20% and 30%—the sampling point 530 is also considered belonging to an interface region 1200 between the macrocells 420 of two nearest nodes 1000. In this case, the interface region 1200 between the first and second macrocells 420 can be thought of as an intermediate cell that includes portions of the first and second macrocells 420 that are within certain internal distance b/2 from the interface 135 between the macrocells 420. The threshold determines the size b of the interface region 1200 in the node-to-node direction.

In another embodiment, a plane can be fit to the interface 135, possibly in the least-squares sense using the nearby points of the method discussed in the previous paragraph. Such a plane might conceivably cut through the cavity 100 interior in a plurality of locations, so a method is needed to bound that portion of the plane that constitutes the interface 135. One approach to doing so is to project the nearby points, which were used to fit the plane, perpendicularly onto the plane, This will allow the local intersection between the plane of the interface 135 and the cavity walls to be identified. As much spatial resolution as is desired can now be incorporated into the interface region 1200, which in this approach has a zero size, possibly by spreading special interface sampling points onto the interface 135 in a manner analogous to that described in connection with FIG. 5 for ordinary sampling points 530. As mentioned previously, many other methods of defining an interface region 1200 are possible, all within the scope of the invention.

Layer Volumes and Thicknesses

As shown in step 348 of FIG. 3, basic geometric properties of macrocells 420 and interfaces 135, namely their volumes and effective thicknesses, are now computed. The effective half-thickness D of a macrocell 420 is evaluated as the depth 560 $d_{max}$ of its deepest sampling point 530, and its volume $V_0$ is evaluated by multiplying the total number of sampling points 530 in the macrocell by $a^3$, the gridcell volume 525.

In an embodiment of the invention in which the interface region 1200 has a nonzero size b, the half-thicknesses $\tilde{D}$ and volume $\tilde{V}_0$ of the interface region 1200 are determined in the same way. By dividing the volume of an interface region 1200 between two macrocells 420 by its size b in the node-to-node direction, the area A corresponding to imagined interface surface between the macrocells 420 may be evaluated, A= $\tilde{V}_0/b$. Also, the unit vector $\vec{n}$ normal to the interface surface is evaluated, for example, from the directions of the two shortest polyline paths 915 connecting the deepest point of the interface region 1200 with the nodes 1000 of the interfacing macrocells 420. On the other hand, in an embodiment of the invention, such as one described previously, in which a planar interface region 1200 is defined, the area A and unit normal $\vec{n}$ can, of course, be computed more directly.

Shape Functions

Figure 13:
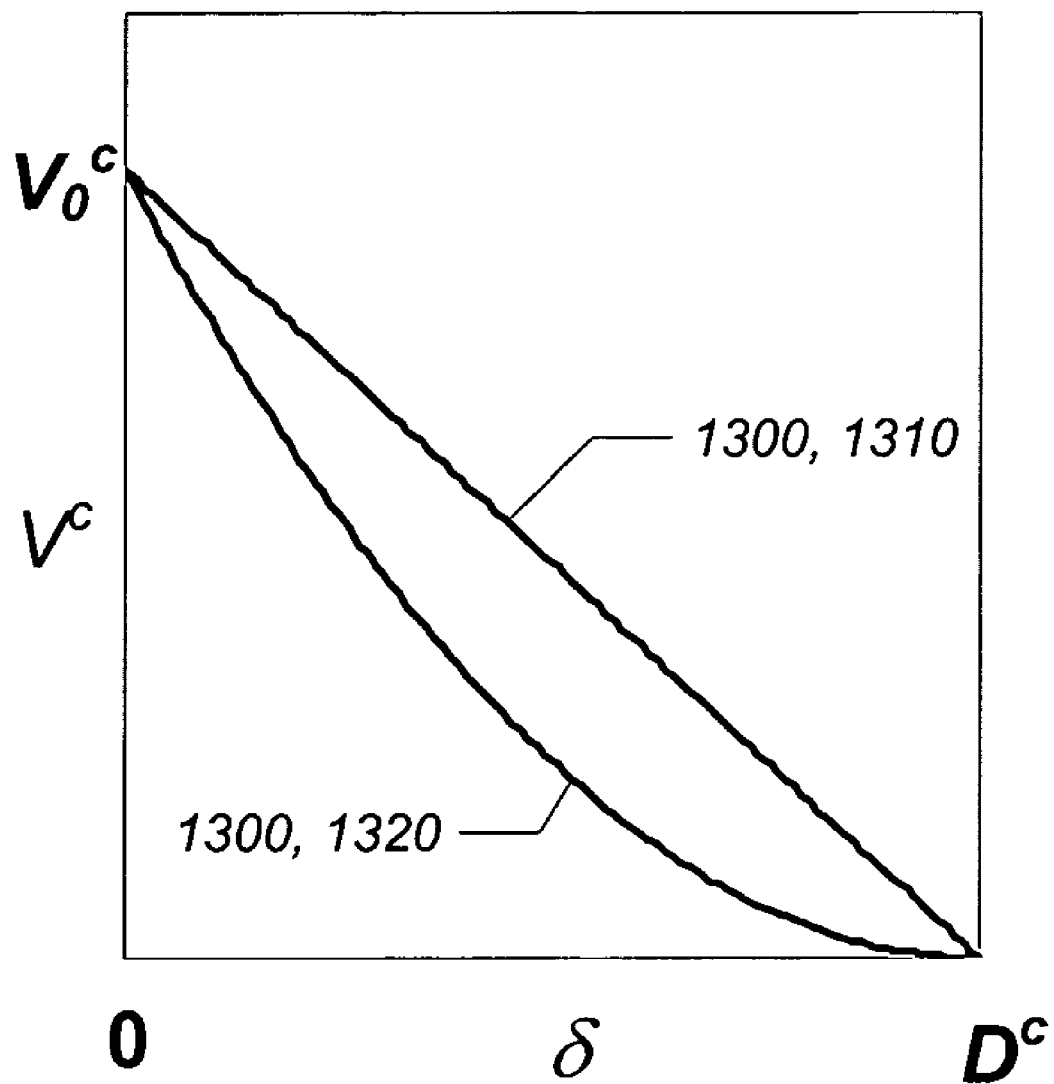
FIG. 13 is a graph of two shape functions contrasting the dependence of volume upon depth between a cylindrical element and a flat element.

The next step 342 in the method described by FIG. 3 is to compute a shape function 1300 for each macrocell 420 and interface region. FIG. 13 shows shape functions 1300 for the two HS cavity 100 geometries, namely, a linear function 1310 for a flat channel 200 and a parabolic function 1320 for a cylindrical channel 180. This figure will be motivated and explained in the discussion below.

In addition to volume and thickness, a macrocell 420 is characterized, in the preferred embodiment, by its shape function 1300 V($\delta$) defined as the volume of the core region of the cell below depth 560 $\delta$ (i.e., separated from the cavity walls 140 by the distance greater than $\delta$). Obviously, V monotonically decreases with increasing $\delta$, from V(0) equal to the volume of the cell $V_0$, to V($D^c$)=0. The difference V($\delta$)−V($\delta_1$), where $\delta > \delta_1$, has a simple geometric meaning. Namely, it is the volume of the intersection of the macrocell 420 with the layer 150 enclosed between two surfaces, both constructed as the offsets of the cavity wall 140, with offset distances (offset depths 560) equal, respectively, to $\delta$ and $\delta_1$. Considering an infinitesimally thin layer between $\delta$ and $\delta_1 = \delta + d\delta$, and expressing the volume of its intersection with the macrocell 420 as S($\delta$)d$\delta$, where S($\delta$) is the area of the $\delta$-offset surface within the macrocell 420, the relation between S($\delta$) and the shape function 1300 Vc($\delta$) is simply $$S(\delta) = \frac{d}{d\delta} V(\delta) \tag{4}$$

For cells 110 in a flat channel with thickness h=$2D^c$, the shape function 1300 V($\delta$)=$V_0(1-\delta/D^c)$, shown in the FIG. 13, is a linear function 1310 of $\delta$, so that S($\delta$)=$V_0/D^c$=const. Note that the $\delta$-offset surface in this case consists of two sheets, each with the area $V_0/2D^c$. On the other hand, for cylindrical elements 115 in a round runner 190 with radius R=$D^c$, the shape function 1300 shown in FIG. 13 is a parabolic function 1320, V($\delta$)=$V_0(1-\delta/D^c)^2$, and S($\delta$)=$2(V_0/D^c)(1-\delta/D^c)$. It is thus possible to distinguish between the macrocells 420 in flat and round channels by analyzing their shape functions 1300, and select the appropriate element model for such macrocells 420. A more complex macrocell 420 will have a shape function 1300 that is neither linear nor parabolic.

When a macrocell 420 is discretized into layers 150, a layer depth can be defined for each layer 150 to be the maximum depth of any point in that layer 150. Each layer depth can be associated with the volume in the macrocell 420 at depths greater than the layer depth. This association represents a discretized form of the shape function 1300. The gridcell volumes 525 corresponding to sampling points 530 can proxy for actual model cavity 100 volumes to simplify this calculation.

In the same way as macrocell shape function 1300, an interface shape function 1330 (not shown) can be defined. In an embodiment in which the interface region 1200 has a nonzero size, an interface region 1200 between macrocells 1 and 2 can be thought of as an intermediate cell that includes a part of macrocell 1 and a part of macrocell 2 that are within certain internal distance b/2 from the "exact border" between cells 1 and 2. The shape function 1300 of the border area is determined by dividing the shape function 1300 of the interface region 1200 by b. In straight channels with nodes 1000 located along the axial line of the channel, and in flat channels with arbitrarily distributed nodes 1000, the interface shape functions are proportional to cell shape functions 1300. In an embodiment in which the interface region 1200 is planar, for the purpose of the shape function 1300 analysis, we can assign the interface region 1200 a unit size b in order to be able to compute $\tilde{V}(\delta)$ based upon the areas of the intersection of the layers 150 with the interface 135 plane.

Shape Functions Affect Equations for Temperature and Velocity

The shape functions 1300 are now taken into account in formulating the governing equations for temperature and velocity (step 350 of FIG. 3). In some embodiments of the invention, the shape functions 1300 are used just to distinguish algorithmically whether a macrocell 420 would be better represented as belonging to a cylindrical channel or a flat channel, and to use a corresponding element model for the macrocell 420. In other embodiments, the shape functions 1300 appear explicitly in generalized HS equations for temperature and velocity profiles in macrocells 420 and interfaces. Namely, the shape functions 1300 determine the coefficients of the discretized equations generalizing equations (A1)-(A5). The generalized equations permit the richness of possible cavity 100 geometries to be incorporated into the model on a basis customized to each individual macrocell 420.

To better explain this approach, we consider the pure cooling process discussed earlier. In this case, the velocity is zero so only the effect of the shape function 1300 on the temperature equation need be considered. The incorporation of shape function 1300 into the velocity equation will be discussed subsequently.

The temperature of resin in a macrocell 420 strongly depends upon depth 560 $\delta$, and also upon time t. Neglecting dependence of the temperature upon other spatial coordinates within the macrocell 420—in other words, "forcing" the temperature to be of the form $$T=T(\delta,t) \tag{5}$$

—the thermal energy E($\delta$, t) contained in the core of the macrocell 420 at depths 560 greater than $\delta$ can be written as $$E(\delta,t)=\int_\delta^D e(T(\delta_1,t))S(\delta_1)d\delta_1 \tag{6}$$

On the other hand, heat flux q($\delta$) carrying heat to the walls 140 at the depth 560 $\delta$ can be written as $$q(\delta,t)=S(\delta)\kappa(T(\delta,t))T'(\delta,t). \tag{7}$$

The sign here differs from the sign in (3) because depth 560 increases in inward direction, while radius r increases in outward direction.

Assuming conductive heat exchange with the neighboring macrocells 420 is small compared with q and neglecting it, the energy balance in the cooling process in the macrocell 420 can be written similarly to (1) as $$\frac{\partial E(\delta, t)}{\partial t} = -q(\delta, t), \quad 0 < \delta < D \tag{8}$$

Together with equations (6) and (7), this shows that the coefficients of the equation expressing energy balance and governing the one-dimensionalized temperature distribution can be written in terms of S($\delta$), which is the derivative of the shape function 1300 V($\delta$). The above technique can be called forced local one-dimensionalization of the balance equations.

For macrocells 420 in flat channels 200, as well as for macrocells 420 in cylindrical channels 180, the assumption that the temperature in the cooling process depends only on the distance from the cavity wall 140 holds exactly. In these two cases the one-dimensionalized equation (8) coincides with the standard HS equations for pure cooling in flat channels 200 and cylindrical channels 180 discussed earlier. For macrocells 420 in channels of other shapes the one-dimensionalized HS equation for cooling, though not exact, provides a convenient engineering approximation.

Essentially the same technique of forced local one-dimensionalization is applied to the balance of forces controlling the velocity field in viscous flow in cavities 100 of various shapes, with coefficients depending, again, on the shape functions 1300 introduced above. Forcing the velocity u to be a function of depth δ and not of other spatial coordinates within a macrocell, and considering it proportional to the gradient of pressure (which is assumed to be approximately constant within a macrocell 420), the velocity profile u(δ, t) in the cell is determined from the one-dimensionalized balance of forces:

$$\eta(T(\delta, t)) \frac{\partial u(\delta, t)}{\partial \delta} S(\delta) = -\nabla p V(\delta). \qquad (9)$$

The one-dimensionalized balance of forces equation can also be applied to the interface regions 1200 between adjacent macrocells 420, producing interface 135 velocity profiles and allowing the evaluation of the total mass flow rates through the interfaces 135. Preferably, thus determined total mass flow rates through the interfaces 135 are used in the equations expressing the balance of mass in macrocells 420. From the mass balance equations, pressure can be determined.

Forced local one-dimensionalization is more adaptable to complex cavity 100 geometries than the 2.5D methods of the prior art, in which all elements have to be forced either flat or cylindrical. Due to this adaptability, forced local one-dimensionalization seems to better render 3D flow patterns. Flow modeling using this approach could be referred to as 2.5D+ modeling.

As with conventional Hele-Show equations, discretizing one-dimensionalized equations for temperature and velocity profiles can be done by subdividing the entire interval of depths 560 in each macrocell 420 and interface regions 1200 into N layers 150. As was mentioned earlier, in some embodiments of the invention, the layers 150 are chosen to be volumetrically equal (so their volumes $V_k$=V/N, while their thicknesses $h_k$ have to be evaluated as (1/N)-quantiles of the depth 560 distribution), as shown in FIG. 4b and FIG. 4c for the simple rectangular channel 400 and cylindrical channel 180 geometries, respectively. The implementation of this choice is very simple—all sampling points 530 belonging to a macrocell 420 are sorted in order of increasing depths 560, and the sequence is divided into groups having essentially equal number of sampling points 530. The difference between the maximum depth 560 in one group and the maximum depth 560 in the previous group is the thickness $h_k$ of the layer. Statistical fluctuations due to randomness of the sampling points 530 introduce fluctuations into thus defined layer depths 560, and to keep them relatively small, a large number of sampling points 530 are required in each layer (200-400 points are usually sufficient). In another embodiment of the invention the layers 150 are chosen to be of equal thickness $h_k$=D/N, and their volumes $V_k$ are evaluated by multiplying gridcell 510 volume $a^3$ by the number of points with depths 560 in the corresponding range. An example is shown in FIG. 1b.

Governing Equations

Finally, the full system of one-dimensionalized equations describing generalized element models for temperature and velocity in the macrocells 420, with the coefficients derived from the shape functions 1300 of macrocells 420 and interface regions 1200 (or, put in another way, based on the thicknesses of volumetrically equal layers 150), is supplemented by the mass balance equations assembled for the flow network. The software routines, as well as the procedures used to iteratively solve these equations and to advance the flow front at each time step, generally follow methods outlined in the above-referenced book Flow Analysis of Injection Molds. The only difference worth mentioning concerns evaluation of pressure gradients in the macrocells 420 and interface regions 1200. Since the collection of nodes 1000 with which pressure variables are associated is not endowed with a proper mesh structure needed for application of finite element interpolation techniques, the pressure gradients have to be evaluated using some other technique, for example, using local linear regression to fit the pressure values at a few nearby nodes.

Running a Simulation

In addition to the geometry of the cavity 100 and, derived from that geometry, shape functions of macrocells 420 affecting the governing equations, various molding process parameters must be specified (FIG. 3 step 355). The parameters include, among others, the temperature of the injected fluid and the pressure at which it is being injected. At this point, a simulation can be run (FIG. 3 step 360) using the modeling software to determine the time evolution of the flow and, in the case of injection molding, to analyze the anticipated resulting part. More runs might be warranted (FIG. 3 step 365) that require only a change of process parameters (FIG. 3 step 355). Eventually, either success will be declared; the model construction process will start over (FIG. 3 step 300) with a different cavity 100 geometry or model configuration; or the project will be abandoned.

CONCLUSION

The method of the present invention is very different from 3D finite element methods such as the method discussed in U.S. Pat. No. 6,186,820. In 3D finite element methods the cavity 100 is subdivided into minute polyhedral mesh elements of standard types. The elements necessarily have to be significantly smaller than the local thickness of the cavity, and most of them have no contacts with the cavity walls. In contrast, the presented method is based on partitioning the cavity 100 into coarse-grained spatial elements, or macrocells 420, connecting the opposing walls 140. Therefore, their sizes cannot be smaller than the local thickness. Also, the macrocells 420 of the presented method usually have irregular shapes unfit for interpolation techniques used in the finite element method.

The method of the present invention also differs dramatically from DUALDOMAIN technology in that it builds a 2.5D+ model by explicitly partitioning the cavity 100 into 3D spatial elements called macrocells 420. It does not involve redundant meshes and does not use synchronization of flow variables in matched elements of such meshes. In addition, the present invention uses generalized, "one dimensionalized" governing equations, which have not been known or used in the prior art, based upon shape functions 1300 for macrocells 420 of non-standard shapes.

Most of the constructs, concepts and tests used in the various embodiments of the invention already described can be modified or even excluded within the spirit and scope of the invention. In particular, randomness of the sampling points 530 is just a convenient and useful, but not necessary, implementation detail. The use of sampling points 530 may also be viewed as just a convenience, as in many cases the borders between the cells 110 can be built by direct geometric construction. Instead of using depth of points to define wall conforming layers, variously defined "effective depths" could be used in other embodiments to smoothen the layers near corners, so they better correspond to actual geometry of temperature and velocity isolines. In other embodiments of the invention, the metric employed to define quasi-Voronoi cells 1020 can be modified in a number of ways. In particular, for many not so intricate parts the use of internal distance may be unnecessary, and Euclidean distance would suffice. In still another embodiment of the invention the internal distance can be modified so that shortest path between two points would be repelled from cavity walls 140, thus being more descriptive of a realistic flow path. Even the use of the concept of Voronoi cells or quasi-Voronoi cells 1020 can be considered an implementation detail, as suitable macrocells 420 can be built with significant deviations from the defining properties of Voronoi cells.

Although the invention has been described with reference to preferred embodiments, workers skilled in the art will recognize that changes may be made in form and detail without departing from the spirit and scope of the invention. In particular, the identification of sampling points 530, nodes 1000, macrocells 420 and shape functions 1300 herein are merely conceptual representations of the algorithms involved, and the invention encompasses the algorithm and its application regardless of whether it is accompanied by the same conceptualization and naming convention.

APPENDIX A

Numerical Hele-Shaw Flow Models

A simple numerical HS flow model (simplified, in particular, by the assumption of constant density and heat capacity of the fluid) is presented below, with the focus on geometric characteristics of cells and layers as they appear in the model equations. The model was derived with quasi-flat and cylindrical cavities in mind; however, it is also directly applicable to more complex cavities partitioned into cells and layers according to the present invention.

The flow front (separating fully filled cells from still filling cells) advances each time when one of the filling cells fills to capacity. Pressure is 0 in the filling cells; in the fully filled cells pressure values are unknown. After each flow front advance, mass and force balance equations are solved at current temperatures and viscosities, yielding pressures and velocities. The shortest time needed to fill up one of the filling cells is then determined, and filled volumes in the remaining filling cells are updated. Also, temperatures and viscosities are updated using energy balance equations.

The pressure gradient $\nabla p$ in a cell can be evaluated by local linear regression, i.e., approximating pressure by a linear function of coordinates that best fits the pressure values in the nodal points inside the cell and its immediate neighbors. The pressure gradient is considered constant within the cell.

The cells are subdivided into layers generally parallel to the walls. In flat elements the layers are assumed to be approximately symmetrical with respect to midplane, and each pair of symmetrical layers is treated as one logical layer having double volume and double surface (the thickness does not double). The layers are assigned indices 1 through N increasing in the inward direction (the number of layers N is the same for all cells). Denoting the thickness and volume of k-th layer in i-th cell as, respectively, $t_{i,k}$ and $v_{i,k}$, the area $S_{i,k}$ of the boundary between two layers with indices k−1 and k can be approximated as $S_{i,k} \approx (V_{i,k}+V_{i,k-1})/(t_{i,k}+t_{i,k-1})$, $N \geq k \geq 1$, and the contact area between the wall and the first layer as $S_{i,1} \approx v_{i,1}/t_{i,1}$. The viscous stress at the boundary between layer k−1 and k can be found from the balance of force applied to a stack of layers with indices $N \geq m \geq k$. In HS approximation, $$\tau_{i,k} = \left(|\nabla p| \sum_{m \geq k} v_{i,m}\right) / S_{i,k}, \tag{A1}$$

where $\tau_{i,k}$ is the magnitude of viscous stress at the closest to the cavity boundary of the k-th layer. The shear rates $\dot{\gamma}_{i,k}$ at the boundaries are related to stresses by the constitutive equation $$\dot{\gamma}_{i,k} = \tau_{i,k}/\eta(\dot{\gamma}_{i,k}, T_{i,k}^*)$$

wherein $\eta$ is viscosity function, and $T_{i,k}^*$ is the temperature at the layer boundary, calculated by interpolation of the temperatures in adjacent layers. On the other hand, shear rate is the derivative of the fluid velocity with respect to coordinate normal to the layers. Taken into account that velocity at the wall is zero, velocity in the center of the first layer can be calculated as $$u_{i,1} = \dot{\gamma}_{i,1} t_{i,1}/2,$$

and in consequent layers as $$u_{i,k} = u_{i,k-1} + \dot{\gamma}_{i,k}(t_{i,k}+t_{i,k-1})/2, \quad N \geq k \geq 1.$$

The direction of velocities is opposite to the direction of $\nabla p$.

The above formulas for velocities can be used to express volumetric balance equations in the fully filled cells in terms of pressures (volumetric balance is equivalent to mass balance due to constant density). Introducing volumetric flow rates $F_{ij}$ through the interface between adjacent cells i and j, for each fully filled cell i $$\sum_j F_{ij} = 0 \tag{A2}$$

wherein the sum extends over adjacent neighbor cells. $F_{ij}$ can be presented as a sum of partial flow rates in the individual layers at the interface between cells i and j:

$$F_{i,j} = \sum_k f_{ij,k}, \quad f_{ij,k} = A_{ij,k}(\vec{u}_{ij,k} \vec{n}_{ij})$$

and velocities $\vec{u}_{ij,k}$ at the interface are interpolated from velocities in the interfacing cells, $\vec{u}_{ij,k} = (\vec{u}_i + \vec{u}_j)/2$, $A_{ij,k}$ is the area of the layer k at the interface, and $\vec{n}_{ij}$ is the unit normal vector at the interface. (Another method of computing interface velocities is described in the section entitled "Detailed Description of the Invention.").

Solution of equations (A2) (with flow rates $F_{i,j}$ expressed via pressures $p_i$ in fully filled cells) determines the pressures and partial flow rates $f_{ij,k}$. It should be noted that equations (A2) express volumetric balance in cells, but not in individual layers, unless transverse interlayer flow rates $f_{i,k}^t$ between adjacent layers in the same cell are introduced (and determined from volumetric balance in the layers). The interlayer flow rates imply that flow lines cross the boundaries between the layers.

After the volumetric balance equations are solved, the computed flow rates can be used to determine filling rates in filling cells. They also appear in the energy balance equations determining temperature changes. Due to the constant volumetric heat capacity, the energy density is proportional to the temperature, and the rate of temperature change in layers due to advection, can be written as $$v_{i,k} \frac{\partial T_{i,k}}{\partial t}\Big|_{advection} = f^t_{i,k+1} T_{i,*} - f^t_{i,k-1} T_{i,*} + \sum_j f_{ij,k} T_{p,*} \quad (A3)$$

where placeholders * have to be replaced in each term by the index of the layer from which fluid flows out (which depends on the sign of the corresponding flux).

The rate of temperature change due to heat conduction can be readily written in terms of partial volumes $v_{i,k}$ and thicknesses $t_{i,k}$ of the layers. Namely, heat fluxes $q_{i,k}$ between the layers with indices k−1 and k are given by $q_{i,k} = 2\kappa\, S_{i,k}(T_{i,k} - T_{i,k-1})/(t_{i,k} + t_{i,k-1})$, $N \geq k \geq 1$, and heat flux into the wall with temperature $T_w$ by $q_{i,1} = 2kS_{i,k}(T_{i,1} - T_w) t_{i,1}$ (k denotes heat conductivity). The rate of temperature change due to heat conduction is given by $$v_{i,k} \frac{\partial T_{i,k}}{\partial t}\Big|_{conduction} = (q_{i,k+1} - q_{i,k})/c, \quad (A4)$$

where c is heat capacity, and $q_{i,N+1} = 0$.

Finally, the rate of temperature change due to viscous heating is $$v_{i,k} \frac{\partial T_{i,k}}{\partial t}\Big|_{visc.heating} = \dot{\gamma}_{i,k} \tau_{i,k} v_{i,k}/c, \quad (A5)$$

Equations for energy balance in layers combine (A3), (A4) and (A5).

What is claimed is:

1. A method for simulating fluid flow in a cavity of arbitrary shape, comprising:
   a. receiving digital data describing walls of a 3D model cavity;
   b. partitioning a portion of the model cavity into a plurality of 3D macrocells, each macrocell having at least one contact area with at least one proximate cavity wall, and at least one macrocell being neither a flat element nor a cylindrical element;
   c. for each macrocell,
      (i) computing, at each of a plurality of values of depth δ, values of a shape function representing the volume of a portion of the macrocell consisting of those points such that the minimum distance from each point to a respective nearest wall exceeds δ, and
      (ii) assigning a plurality of discretized model equations, adapted to governing a simulated evolution of the fluid, including a model equation having at least one coefficient derived from the shape function; and
   d. running a simulation using the discretized model equations to produce a plurality of model flow variables at a plurality of times within the simulation and storing a data structure representing a model flow variable in a digital storage device, wherein the step of running the simulation is performed using a digital computer.

2. The method of claim 1, wherein the discretized model equations govern the simulated evolution of a molten material that is injected into the cavity, the model cavity specifying the geometry intended for a part to be molded.

3. The method of claim 2, wherein the material is a polymer resin.

4. The method of claim 1, wherein the discretized model equations include a temperature equation having a coefficient derived from the shape function.

5. The method of claim 1, step c further comprising:
   (iii) dividing the macrocell into non-overlapping layers, each layer including those points such that the minimum distance from each point to a respective nearest wall is between two values of depth, and
   (iv) using a value of depth δ taken from within each layer in computing values of the shape function.

6. The method of claim 5, wherein all the layers contain the same volume.

7. The method of claim 1, further comprising:
   e. selecting within the portion of the model cavity a set of sampling points with known density, and using the sampling points for representation of macrocells and evaluation of the shape functions of the macrocells.

8. The method of claim 1, the step of partitioning a portion of the model cavity including:
   (i) selecting a plurality of nodes at points located throughout the portion of the model cavity;
   (ii) choosing a model metric that specifies how model distance will be computed between any pair of points within the model cavity; and
   (iii) constructing macrocells by Voronoi partitioning, based on the nodes and the model metric.

9. The method of claim 8, wherein internal distance between two sampling points is defined to be the length of the shortest polyline path between the two sampling points that is internal to the model cavity, and the model metric specifies that the distance between any two sampling points will be calculated by internal distance.

10. The method of claim 8, wherein each node is substantially equidistant from opposing model cavity walls.

11. The method of claim 1, wherein the portion of the model cavity contains at least one feature from the group consisting of
   (i) an intersection of two substantially planar regions,
   (ii) an intersection of two runners,
   (iii) an intersection of a runner and a planar region,
   (iv) a serrated region of wall,
   (v) a corrugated region of wall, and
   (vi) an indentation in a wall.

12. A method for use in the art of molding objects, comprising:
   a. obtaining data, stored in tangible digital media, describing walls of a 3D model cavity;
   b. partitioning a portion of the model cavity into a plurality of 3D macrocells, each macrocell having at least one contact area with at least one contact area with at least one proximate cavity wall, and at least one macrocell being neither a flat element nor a cylindrical element;
   c. for each macrocell,
      (i) computing, at each of a plurality of values of depth δ, values of a shape function representing the volume of a portion of the macrocell consisting of those points such that the minimum distance from each point to a respective nearest wall exceeds δ, and (ii) assigning a plurality of discretized model equations, adapted to governing a simulated evolution of fluid flow through the cavity, including a discretized model equation having at least one coefficient derived from the shape function;
d. running a simulation using the discretized model equations on a digital electronic device, thereby producing a plurality of model variables characterizing the simulated evolution of the fluid flow; and
e. using at least one of the plurality of model variables characterizing the simulated evolution of the fluid flow, making a prediction of a quality factor that would result if an object were to be molded using a tangible mold that has a mold cavity represented by the 3D model cavity.

13. The method of claim 12, wherein the quality factor is in the group consisting of
   (i) whether fluid will fill the mold cavity before freezing;
   (ii) whether the object will contain bubbles;
   (iii) whether there will be regions of weakness in the object; and
   (iv) whether the object will have burns or blemishes.

14. The method of claim 12, further comprising:
f. based on the prediction, choosing whether to fabricate a tangible mold that has a mold cavity represented by the 3D model cavity.

15. The method of claim 14, further comprising:
g. fabricating a tangible mold that has a mold cavity represented by the 3D model cavity.

16. The method of claim 15, further comprising:
h. injecting molten material into the tangible mold.

17. The method of claim 12, further comprising:
f. based on the prediction, redesigning a mold or a part, or terminating a project.

18. A method for molding an object, comprising:
a. obtaining data, stored in tangible digital media, describing walls of a 3D model cavity;
b. partitioning a portion of the model cavity into a plurality of 3D macrocells, each macrocell having at least one contact area with at least one contact area with at least one proximate cavity wall, and at least one macrocell being neither a flat element nor a cylindrical element;
c. for each macrocell,
   (i) computing, at each of a plurality of values of depth $\delta$, values of a shape function representing the volume of a portion of the macrocell consisting of those points such that the minimum distance from each point to a respective nearest wall exceeds $\delta$, and
   (ii) assigning a plurality of discretized model equations, adapted to governing a simulated evolution of fluid flow through the cavity, including a discretized model equation having at least one coefficient derived from the shape function;
d. running a simulation using the discretized model equations on a digital electronic device, thereby producing a plurality of model variables characterizing the simulated evolution of the fluid flow;
e. using at least one of the plurality of model variables characterizing the simulated evolution of the fluid flow, making a prediction of success of the model cavity for producing the molded object; and
f. if the prediction is favorable, injecting molten material into a tangible mold having walls substantially corresponding to the walls of the 3D model cavity.

* * * * *

UNITED STATES PATENT AND TRADEMARK OFFICE
CERTIFICATE OF CORRECTION

PATENT NO. : 7,574,339 B2
APPLICATION NO. : 11/523232
DATED : August 11, 2009
INVENTOR(S) : Lawrence J. Lukis et al.

It is certified that error appears in the above-identified patent and that said Letters Patent is hereby corrected as shown below:

TitlePage;
On first page, in field (56), under "Other Publications", in column 2, line 2, delete "imcompressible" and insert -- incompressible --, therefor.

In column 3, line 11, delete "ore" and insert -- or --, therefor.

In column 3, line 61, delete "1D" and insert -- a 1D --, therefor.

In column 14, line 35, delete "_dist" and insert -- _ dist --, therefor.

In column 18, line 30, delete "plane, This" and insert -- plane. This --, therefor.

In column 19, line 12, delete "V(0)" and insert -- V(0) --, therefor.

In column 19, line 13-14, delete " $V(\delta) - V(\delta_1),$ " and insert -- $V(\delta) - V(\delta_1),$ --, therefor. (Equation must be in one line)

In column 19, line 23, delete "Vc(δ)" and insert -- V(δ) --, therefor.

In column 19, line 26, delete " $S(\delta) = \frac{d}{d\delta} V(\delta)$ " and insert -- $S(\delta) = -\frac{d}{d\delta} V(\delta)$ --, therefor.

In column 19, line 55-56, delete "1 and 2" and insert -- 1 and 2 --, therefor.

In column 19, line 57, delete "1" and insert -- 1 --, therefor.

In column 19, line 57, delete "2" and insert -- 2 --, therefor.

In column 19, line 59, delete "1 and 2." and insert -- 1 and 2. --, therefor.

Signed and Sealed this
First Day of March, 2011

David J. Kappos
*Director of the United States Patent and Trademark Office*

CERTIFICATE OF CORRECTION (continued)
U.S. Pat. No. 7,574,339 B2

In column 20, line 11, after "channel" insert -- 180 --.

In column 20, line 12, delete "channel," and insert -- channel 200, --, therefor.

In column 22, line 8, delete "Flow Analysis of Injection Molds." and insert -- *Flow Analysis of Injection Molds.* --, therefor.

In column 23, line 4, delete "smoothen" and insert -- smooth --, therefor.

In column 23, line 67, delete " $S_{i,k} \approx (V_{i,k} + V_{i,k-1})/(t_{i,k} + t_{i,k-1}),$ " and insert -- $S_{i,k} \approx (v_{i,k} + v_{i,k-1})/(t_{i,k} + t_{i,k-1}),$ --, therefor.

In column 23, line 67, delete " $N \geq k \geq 1,$ " and insert -- $N \geq k > 1,$ --, therefor.

In column 24, line 1-2, delete " $S_{i,1} \approx V_{i,1}/t_{i,1}.$ " and insert -- $S_{i,1} \approx v_{i,1}/t_{i,1}.$ --, therefor. (Equation must be in one line)

In column 24, line 28, delete " $N \geq k \geq 1.$ " and insert -- $N \geq k > 1.$ --, therefor.

In column 24, line 55, delete " $\vec{n}\,ij$ " and insert -- $\vec{n}_{ij}$ --, therefor.

In column 24, line 63, delete " $f_{i,k}{}^{t}$ " and insert -- $f_{i,k}^{t}$ --, therefor.

In column 25, line 21, delete " $N \geq k \geq 1,$ " and insert -- $N \geq k > 1,$ --, therefor.

In column 25, line 22, delete " $q_{i,1} = 2kS_{i,k}(T_{i,1} - T_w)t_{i,1}$ " and insert -- $q_{i,1} = 2\kappa S_{i,k}(T_{i,1} - T_w)/t_{i,1}$ --, therefor.

In column 25, line 22, delete "(k" and insert -- (_--, therefor.